US009991963B2

(12) United States Patent
Selim et al.

(10) Patent No.: US 9,991,963 B2
(45) Date of Patent: Jun. 5, 2018

(54) MULTI-CHANNEL TUNABLE LASER

(71) Applicant: Huawei Technologies Co., Ltd., Shenzhen (CN)

(72) Inventors: Ramsey Selim, Munich (DE); Karl Boylan, Reading (GB); Ian Lealman, Ipswich (GB); Richard Wyatt, Ipswich (GB); David Rogers, Ipswich (GB)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days. days.

(21) Appl. No.: 14/954,196

(22) Filed: Nov. 30, 2015

(65) Prior Publication Data
US 2016/0156415 A1    Jun. 2, 2016

(30) Foreign Application Priority Data
Dec. 1, 2014   (EP) ..................... 14195586

(51) Int. Cl.
H04J 14/00    (2006.01)
H04J 14/02    (2006.01)
(Continued)

(52) U.S. Cl.
CPC ......... *H04B 10/503* (2013.01); *H01S 5/0268* (2013.01); *H01S 5/0607* (2013.01);
(Continued)

(58) Field of Classification Search
CPC ... H04B 10/503; H01S 5/0268; H01S 5/0607; H01S 5/0612
(Continued)

(56) References Cited

U.S. PATENT DOCUMENTS 5,414,548 A * 5/1995 Tachikawa ......... G02B 6/12014
385/14
6,167,168 A * 12/2000 Dieckroeger ...... G02B 6/12033
385/1
(Continued)

FOREIGN PATENT DOCUMENTS

EP       1058358 A1    12/2000
JP     H07183622 A     7/1995
(Continued)

OTHER PUBLICATIONS

Bukkems et al., "A Tunable-MMI-Coupler-Based Wavelength Adjustable Laser," IEEE Journal of Quantum Electronics, vol. 43, No. 7, pp. 614-621, Institute of Electrical and Electronics Engineers, New York, New York (Jul. 2007).
(Continued)

Primary Examiner — Oommen Jacob
(74) Attorney, Agent, or Firm — Leydig, Voit & Mayer, Ltd.

(57) ABSTRACT

A multi-channel tunable laser includes: a frequency selective optical multiplexer comprising: a plurality of channel terminals for receiving/transmitting light; a plurality of channel waveguide blocks, each channel waveguide block comprising at least one reflectively terminated channel waveguide; and an optical coupling element optically coupling the plurality of channel terminals with the plurality of channel waveguide blocks, each of the channel waveguides of the plurality of channel waveguide blocks having a different length; a plurality of channel paths, each channel path coupled to a respective channel terminal of the plurality of channel terminals and comprising a gain element, a phase element and a reflective element; and a plurality of optical tuners, each one configured to tune the channel waveguides
(Continued)

of a respective channel waveguide block of the plurality of channel waveguide blocks.

16 Claims, 27 Drawing Sheets

(51) Int. Cl.

| | | |
|---|---|---|
| G02B 6/28 | (2006.01) | |
| H04B 10/50 | (2013.01) | |
| H01S 5/06 | (2006.01) | |
| H01S 5/10 | (2006.01) | |
| H01S 5/14 | (2006.01) | |
| H01S 5/40 | (2006.01) | |
| H01S 5/026 | (2006.01) | |
| H01S 5/028 | (2006.01) | |
| H01S 5/062 | (2006.01) | |
| H01S 5/12 | (2006.01) | |

(52) U.S. Cl.
CPC .......... *H01S 5/0612* (2013.01); *H01S 5/1007* (2013.01); *H01S 5/1092* (2013.01); *H01S 5/141* (2013.01); *H01S 5/4062* (2013.01); *H04J 14/00* (2013.01); *H01S 5/0261* (2013.01); *H01S 5/0287* (2013.01); *H01S 5/06246* (2013.01); *H01S 5/1212* (2013.01)

(58) Field of Classification Search
USPC ..................................... 398/43; 385/37, 2, 3
See application file for complete search history.

(56) References Cited

U.S. PATENT DOCUMENTS

| | | | | |
|---|---|---|---|---|
| 6,339,664 | B1* | 1/2002 | Farjady | G02B 6/12033 385/24 |
| 6,385,353 | B1* | 5/2002 | Boyne | G02F 1/011 359/332 |
| 6,853,773 | B2* | 2/2005 | Lin | G02B 6/12011 385/1 |
| 6,931,036 | B2 | 8/2005 | Thourhout | |
| 7,092,589 | B2 | 8/2006 | Kish, Jr. et al. | |
| 7,110,627 | B2 | 9/2006 | Rahman | |
| 7,136,553 | B2 | 11/2006 | Kwon et al. | |
| 9,366,819 | B1* | 6/2016 | Bauters | G02B 6/12016 |
| 2004/0017971 | A1* | 1/2004 | Johannessen | G02B 6/12014 385/37 |
| 2004/0161200 | A1* | 8/2004 | Singh | G02B 6/2808 385/46 |
| 2005/0111848 | A1* | 5/2005 | Grubb | G02B 6/12007 398/147 |
| 2005/0157984 | A1* | 7/2005 | Han | G02B 6/12014 385/47 |
| 2006/0263098 | A1* | 11/2006 | Akiyama | G02F 1/0123 398/188 |
| 2007/0133649 | A1* | 6/2007 | Kwon | H01S 5/141 372/102 |
| 2008/0019638 | A1* | 1/2008 | Kwon | G02B 6/12007 385/29 |
| 2009/0185806 | A1* | 7/2009 | Das | G02B 6/12011 398/68 |
| 2011/0216789 | A1* | 9/2011 | Docter | H01S 5/06256 372/20 |
| 2012/0057079 | A1* | 3/2012 | Dallesasse | H01S 5/021 348/724 |
| 2013/0223844 | A1* | 8/2013 | Hwang | H04B 10/572 398/91 |
| 2014/0178004 | A1* | 6/2014 | Capmany Francoy | G02B 6/12033 385/37 |
| 2016/0156415 | A1* | 6/2016 | Selim | H04B 10/503 398/43 |
| 2016/0315451 | A1* | 10/2016 | de Valicourt | H01S 5/4087 |

FOREIGN PATENT DOCUMENTS

| | | |
|---|---|---|
| JP | H07333446 A | 12/1995 |
| JP | H0955552 A | 2/1997 |

OTHER PUBLICATIONS

Okamoto et al., "Fabrication of silicon reflection-type arrayed-waveguide gratings with distributed Bragg reflectors," Optics Letters, vol. 38, Issue 18, pp. 3530-3533, OSA Publishing, Washington, DC (2013).

Babaud et al., "First Integrated Continuously Tunable AWG-Based Laser Using Electro-Optical Phase Shifters," COBRA Research Institute, University of Technology Eindhoven, Eindhoven, Netherlands (2005).

Heck et al., "Monolithic AWG-based Discretely Tunable Laser Diode With Nanosecond Switching Speed," IEEE Photonics Technology Letters, vol. 21, No. 13, pp. 905-907, Institute of Electrical and Electronics Engineers, New York, New York (Jul. 1, 2009).

Bukkems, "New Approaches to Widely Tunable Semiconductor Lasers," pp. 1-179, University of Technology Eindhoven, Eindhoven, Netherlands (Feb. 13, 2006).

Heaton et al., "Novel 1toN way integrated optical beam splitters using symmetric mode mixing in GaAs/AlGaAs multimode waveguides," Applied Physics Letters, vol. 61, No. 15, AIP Publishing, Melville, New York (Oct. 12, 1992).

Docter et al., "Novel Integrated Tunable Laser using Filtered Feedback for simple and very fast tuning," 35$^{th}$ European Conference on Optical Communication, Vienna, Austria, Institute of Electrical and Electronics Engineers (Sep. 20-24, 2009).

Tachikawa et al., "32 wavelength tunable arrayed-waveguide grating laser based on special input/output arrangement," IEE Electronic Letters, vol. 31, No. 19, Institute of Electrical and Electronics Engineers, New York, New York (Sep. 14, 1995).

Van Thourhout et al., "Demonstration of multi-wavelength laser with a gain-clamped output amplifier," IEEE Lasers and Electro-Optics Society Annual Meeting , Orlando, Florida, pp. 192-193, Institute of Electrical and Electronics Engineers, New York, New York (Dec. 3-4, 1998).

Lawniczuk et al., "AWG-Based Photonic Transmitter With DBR Mirrors and Mach-Zehnder Modulators," IEEE Photonics Technology Letters, vol. 26, No. 7, Institute of Electrical and Electronics Engineers, New York, New York (Apr. 1, 2014).

Lawniczuk et al, "Design of integrated photonic transmitter for application in Fiber-to-the-Home systems," Photonics Applications in Astronomy, Communications, Industry, and High-Energy Physics Experiments 2010, vol. 7745, SPIE, Bellingham, Washington (Sep. 2010).

Zhao et al., "Experimental demonstration of monolithically integrated 16 channel DFB laser array fabricated by nanoimprint lithography with AWG multiplexer and SOA for WDM-PON application," Optics Communications vol. 339, pp. 78-85, (Nov. 24, 2014).

First Office Action in cognate Japanese Patent Application No. 2015233094 (dated Nov. 29, 2016).

* cited by examiner

MULTI-CHANNEL TUNABLE LASER

CROSS-REFERENCE TO RELATED APPLICATION

This application claims priority to European Patent Application No. EP14195586.4, filed on Dec. 1, 2014, which is hereby incorporated by reference in its entirety.

TECHNICAL FIELD

The present disclosure relates to a multi-channel tunable laser, in particular a widely tunable multi-channel laser using half an Arrayed Waveguide Grating (AWG) for tuning a plurality of optical channels and a method for multi-channel tuning laser light.

BACKGROUND

Wavelength-agile single-frequency laser diodes are being regarded as essential components for various telecommunication applications. Such laser diodes can be used as backups for fixed-wavelength transmitters. With wavelength division multiplexing (WDM) communication systems operating on a large number of optical wavelength channels, a large number of fixed-wavelength transmitters have to be kept as spares, which produces high additional costs. However, with a widely tunable laser that is able to operate on any of the available optical channels, costs can be significantly reduced. Tunable lasers are becoming enabling key components for optical networks. They can be used for functionalities like packet switching, wavelength conversion and light modulation, thereby making optical networks more flexible. Besides these applications, tunable lasers or laser diodes are also attractive light sources for sensing applications as well as for Fiber Bragg Grating (FBG) based sensor devices.

There is a need in telecommunication for tunable lasers, especially integrated multi-channel widely tunable (i.e. full C-band) lasers optimized for tuning to enable a narrow line-width to be maintained across the devices' full wavelength range. Currently industry companies use different methods to realize tunable lasers, for example such as e-beam exposure, DSDBR (Distributed Supermode Distributed Bragg Reflection) or usage of multiple SOAs (Semiconductor Optical Amplifiers). Currently available tunable lasers have demanding processes or suffer from large footprint. Both lead to high cost due to waste of chip space or complexity of fabrication process.

There is a need to provide a multi-channel tunable laser that is easy to manufacture, in particular a multi-channel tunable laser that requires small chip space and that may be easily produced in a chip fabrication process.

SUMMARY

It is the object of the invention to provide a widely tuneable laser enabling a narrow line-width across a full optical wavelength spectrum that is easy to be manufactured.

This object is achieved by the features of the independent claims. Further implementation forms are apparent from the dependent claims, the description and the figures.

In order to describe the invention in detail, the following terms, abbreviations and notations will be used:
AWG: Arrayed Waveguide Grating,
FBG: Fiber Bragg Grating,
DSDBR: Distributed Supermode Distributed Bragg Reflection,
SOA: Semiconductor Optical Amplifier,
C-band: wavelength range between 1530 nm and 1565 nm standardized as one particular telecom window.

According to a first aspect, the invention relates to a multi-channel tunable laser, comprising: a frequency selective optical multiplexer comprising: a plurality of channel terminals for receiving/transmitting light; a plurality of channel waveguide blocks, each channel waveguide block comprising at least one reflectively terminated channel waveguide; and an optical coupling element optically coupling the plurality of channel terminals with the plurality of channel waveguide blocks, each of the channel waveguides of the plurality of channel waveguide blocks having a different length; a plurality of channel paths, each channel path coupled to a respective channel terminal of the plurality of channel terminals and comprising a gain element, a phase element and a reflective element; and a plurality of optical tuners, each one configured to tune the channel waveguides of a respective channel waveguide block of the plurality of channel waveguide blocks.

Such multi-channel tuneable laser provides a wide tuning as different lasing modes can be provided by the light beams travelling through the at least one block of channel waveguides. The optical multiplexer is frequency selective and the structure of the channel waveguides, each one having a different length allows producing a narrow line-width lasing mode across a full optical wavelength spectrum for multiple channels. As the block of channel waveguides is reflectively terminated to reflect the light beams travelling through the channel waveguides and coupled to the optical coupling element where the different wavelengths are superimposed to produce the lasing modes of the different optical channels, the length of the channel waveguides can be reduced compared to conventional (single-channel) tuneable lasers based on Arrayed Waveguide Grating.

In a first possible implementation form of the multi-channel tunable laser according to the first aspect, the frequency selective optical multiplexer comprises a half section of an arrayed waveguide grating multiplexer.

By using a half section of an arrayed waveguide grating multiplexer, chip space can be reduced thereby the tunable laser can be easily and cost-efficiently manufactured. Further, energy losses due to the light beams traveling through half the distance can be reduced. Hence, optical amplifiers can be saved.

In a second possible implementation form of the multi-channel tunable laser according to the first aspect as such or according to the first implementation form of the first aspect, the reflective termination of the at least one reflectively terminated channel waveguide is outside of the optical coupling element.

When the reflective termination of the at least one reflectively terminated channel waveguide is outside of the optical coupling element, production of the reflective termination can be decoupled from production of the optical coupling element. This can improve manufacturing tolerances and can result in a more simple production.

In a third possible implementation form of the multi-channel tunable laser according to the first aspect as such or according to any of the preceding implementation forms of the first aspect, the reflective termination of the at least one reflectively terminated channel waveguide comprises one of a reflective coating, a broadband grating and a mirror.

The reflective termination can be implemented by a lot of reflective means. Hence, the production of reflective termination can be adapted to the specific use making the application of the multi-channel tunable laser flexible with respect to a lot of different requirements.

In a fourth possible implementation form of the multi-channel tunable laser according to the first aspect as such or according to any of the preceding implementation forms of the first aspect, the plurality of optical tuners are configured to modify a refractive index of the channel waveguides based on at least one of the following: Thermal tuning, Current injection, Voltage, Stress.

The design of the multi-channel tunable laser is very flexible. Depending on the requirements and the environment where the laser is applied different techniques for optical tuning can be applied such as denoted above.

In a fifth possible implementation form of the multi-channel tunable laser according to the first aspect as such or according to any of the preceding implementation forms of the first aspect, the plurality of optical tuners are independently tunable.

When the plurality of optical tuners are independently tunable both techniques of discontinuous tuning using the Vernier effect as well as continuous tuning between supermodes to access all cavity modes can be applied, thereby providing a high degree of tuning flexibility.

In a sixth possible implementation form of the multi-channel tunable laser according to the first aspect as such or according to any of the preceding implementation forms of the first aspect, the optical coupling element comprises a free propagation region coupling the plurality of channel terminals with the plurality of channel waveguide blocks such that light beams travelling through the plurality of channel waveguide blocks are constructively and destructively interfering in the free propagation region.

Such a free propagation region makes light diffracting out of the channel terminals propagating through the free propagation region and illuminating the channel waveguides, for example with a Gaussian distribution. Light diffracted from each waveguide can interfere constructively and destructively in the free propagation region.

In a seventh possible implementation form of the multi-channel tunable laser according to the sixth implementation form of the first aspect, the free propagation region is designed such that a light beam tuned by at least one of the optical tuners is propagating through the free propagation region without interfering with a light beam tuned by another one of the optical tuners.

When a light beam tuned by one of the optical tuners is propagating through the free propagation region without interfering with a light beam tuned by another one of the optical tuners, the different optical channels of the laser can be independently tuned by the optical tuners.

In an eighth possible implementation form of the multi-channel tunable laser according to the first aspect as such or according to any of the preceding implementation forms of the first aspect, the optical coupling element comprises a multi-star coupler.

Such a multi-star coupler corresponding to a plurality of parallel star couplers implemented as one optical coupler is able to optically combine the light beams travelling through the different branches of the block of channel waveguides in a power-efficient manner. By selecting a coupling ratio of each star coupler of the multi-star coupler a maximum amount of output power at a minimum amount of input current can be provided by the laser.

In a ninth possible implementation form of the multi-channel tunable laser according to the eighth implementation form of the first aspect, the multi-star coupler is designed to couple a respective portion of the channel waveguides to a respective channel terminal of the plurality of channel terminals.

By using such a multi-star coupler multiple independent optical channels can be realized, each optical channel associated with one of the channel terminals of the optical coupler.

In a tenth possible implementation form of the multi-channel tunable laser according to the eighth implementation form or the ninth implementation form of the first aspect, the multi-star coupler is designed based on a Rowland Circle.

The Rowland circle is a circle having the radius of curvature of a concave diffraction grating as diameter. The Rowland circle has the property that, if a slit is placed anywhere on the circumference of the Rowland circle, the spectra of various orders are formed in exact focus also round the circumference of the Rowland circle. Hence, the multi-channel laser can very efficiently and accurately couple out the optical channels.

In an eleventh possible implementation form of the multi-channel tunable laser according to the tenth implementation form of the first aspect, an angle of the Rowland circle is designed such that light beams propagating through different channel terminals of the plurality of channel terminals do not interfere.

When light beams propagating through different channel terminals of the plurality of channel terminals do not interfere, the different channels of the laser are independently tunable by the second optical tuners.

In a twelfth possible implementation form of the multi-channel tunable laser according to the first aspect as such or according to any of the preceding implementation forms of the first aspect, the optical tuners are configured to tune the channel waveguides so as to produce light of a single frequency in each of the channel paths; or to tune the channel waveguides so as to produce light of a full predetermined range of frequencies in each of the channel paths.

By such optical tuners the multi-channel tunable laser can flexibly produce optical channels of single frequencies or of whole frequency bands.

In a thirteenth possible implementation form of the multi-channel tunable laser according to the twelfth implementation form of the first aspect, the optical tuners are configured to tune the channel waveguides so as to produce a different single frequency or to produce the same single frequency in each of the channel paths.

By such optical tuners the multi-channel tunable laser can flexibly produce multiple optical channels each one having a different single frequency or each one having the same single frequency.

According to a second aspect, the invention relates to a method for multi-channel tuning laser light, the method comprising: receiving/transmitting light beams by plurality of channel terminals of a frequency selective optical multiplexer, each channel terminal coupled to a respective channel path of a plurality of channel paths, wherein each channel path comprises a gain element, a phase element and a reflective element; and wherein the frequency selective optical multiplexer comprises a plurality of channel waveguide blocks, each channel waveguide block comprising at least one reflectively terminated channel waveguide, and an optical coupling element optically coupling the plurality of channel terminals with the plurality of channel waveguide blocks, each of the channel waveguides of the plurality of channel waveguide blocks having a different length; and tuning the channel waveguides of a respective channel waveguide block by a plurality of optical tuners, each one coupled to a respective channel waveguide block of the plurality of channel waveguide blocks.

Such a method provides a wide tuning as different lasing modes can be provided by the light beams traveling through the at least one block of channel waveguides. The optical multiplexer is frequency selective and the structure of the channel waveguides, each one having a different length allows producing a narrow line-width lasing mode across a full optical wavelength spectrum for multiple channels.

According to a third aspect, the invention relates to a multi-channel tunable laser using half an arrayed waveguide grating (AWG) with high reflectivity coating and two tuning elements that thermally tune the half AWG branches so as to create two AWGs out of the half an AWG.

The multi-channel tunable laser may use half an arrayed waveguide grating with a high reflectivity (HR) coating and tuning elements that thermally tune the half AWG branches so as to create two AWGs out of the half AWG. These two AWGs may or may not share the same multi-star coupler or other combining methods. The AWG acts as an external cavity for the laser, and the half AWG reduces the footprint of the chip, complexity of the fabrication process and thereby reduces the chip cost. The passive chirped grating acts as a broadband waveguide reflector for integration with other components. Other reflective means may serve the same purpose.

This new architecture halves the size with respect to other comparable existing solutions.

BRIEF DESCRIPTION OF THE DRAWINGS

Further embodiments of the invention will be described with respect to the following figures, in which:

FIG. 21b shows a schematic diagram illustrating one single-channel tunable laser 2101 that is used in the multi-channel tunable laser 2100 of FIG. 21a.

DETAILED DESCRIPTION OF EMBODIMENTS

Figure 1:
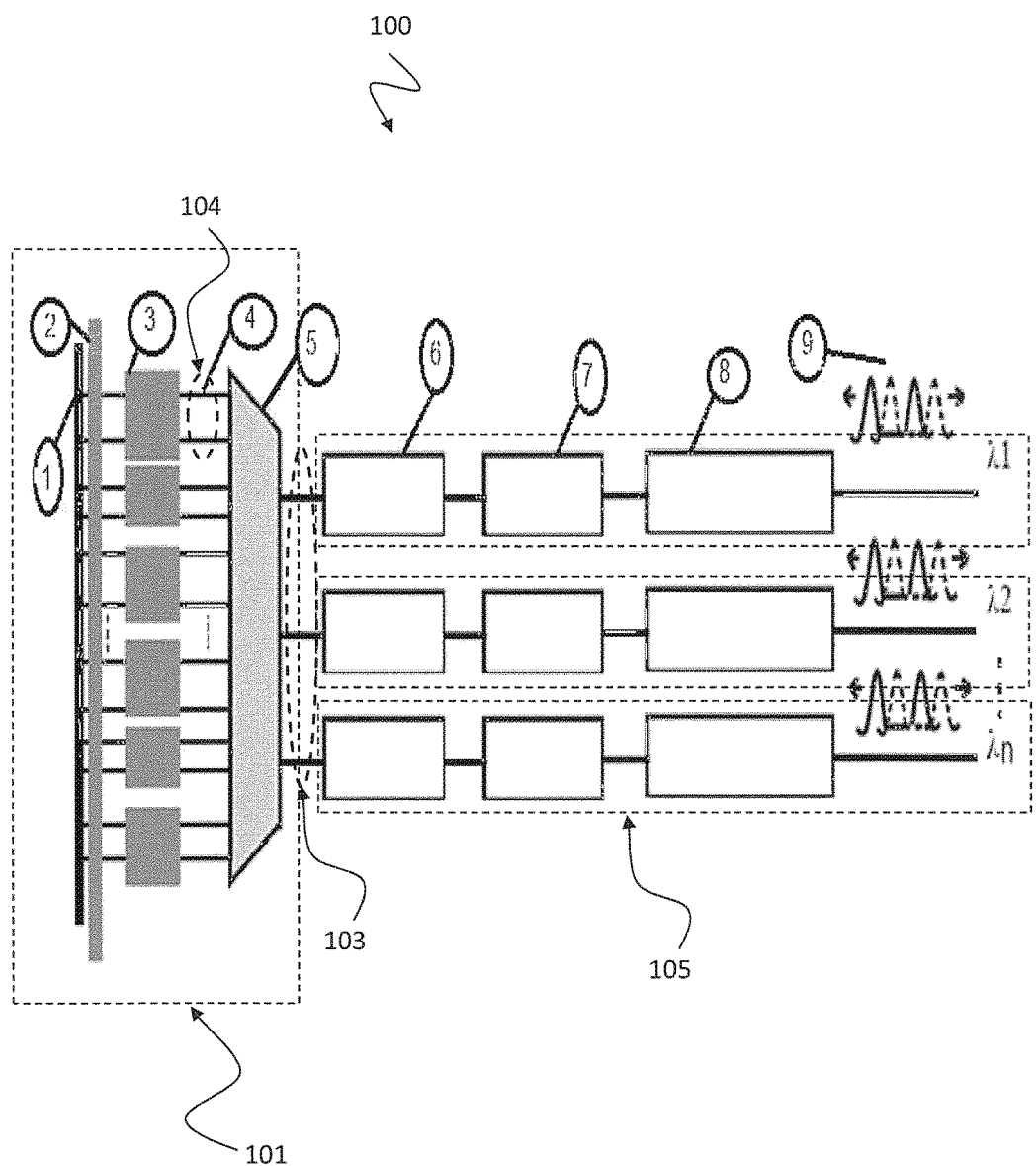
FIG. 1 shows a schematic diagram illustrating the architecture of a multi-channel tunable laser 100 according to an implementation form.

In the following detailed description, reference is made to the accompanying drawings, which form a part thereof, and in which is shown by way of illustration specific aspects in which the disclosure may be practiced. It is understood that other aspects may be utilized and structural or logical changes may be made without departing from the scope of the present disclosure. The following detailed description, therefore, is not to be taken in a limiting sense, and the scope of the present disclosure is defined by the appended claims.

It is understood that comments made in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

The devices and methods described herein may be based on multi-channel tunable lasers and methods for tuning lasing modes. A tunable laser is a laser whose wavelength of operation can be altered in a controlled manner. While all laser gain media allow small shifts in output wavelength, only a few types of lasers allow continuous tuning over a significant wavelength range. A widely tunable laser allows continuous tuning over the full C-Band. A multi-channel tunable laser allows tuning of multiple optical channels, in particular tuning of multiple independent optical channels.

The methods and devices described herein may be implemented for producing integrated optical chips. The described devices and systems may include integrated circuits and/or passives and may be manufactured according to various technologies. For example, the circuits may include logic integrated circuits, analog integrated circuits, mixed signal integrated circuits, optical circuits, memory circuits and/or integrated passives.

In the following description methods and devices using (optical) waveguides are described. An optical waveguide is a physical structure that guides electromagnetic waves in the optical spectrum. Common types of optical waveguides include optical fiber and rectangular waveguides. Optical waveguides can be classified according to their geometry, e.g. as planar, strip, or fiber waveguides, mode structure, e.g. as single-mode or multi-mode, refractive index distribution, e.g. step or gradient index distribution and material, e.g. glass, polymer or semiconductor.

In the following description methods and devices using optical multiplexers and optical de-multiplexers are described. An optical multiplexer multiplexes the wavelength channels onto one or more output fibers, also denoted as terminals or channel terminals of the optical multiplexer. The optical de-multiplexer separates wavelengths in one or more input fibers, e.g. terminals, of the de-multiplexer onto ports, e.g. channel waveguides. A frequency selective optical multiplexer as described in the following sections includes both, optical multiplexing as well as optical de-multiplexing.

In the following detailed description methods and devices using laser structures are described. A laser structure comprises a two-sided active section/region, creating a light beam by spontaneous emission over a bandwidth around some center frequency and guiding said light beam, the active section performing optical amplification actions and two inactive or passive sections/regions, acting as reflectors. The active section is bounded by the two reflectors. Besides inactive or passive reflecting sections/regions, also sections with a transmission characteristic exist.

In the following detailed description methods and devices using reflective elements, reflective terminations or reflectors and sections with transmission characteristics such as waveguides are described. The reflectors and sections with transmission characteristics are commonly denoted as resonators. Reflection and transmission sections are functionally characterized as having a reflection or transmission characteristic with a plurality of reflection or transmission peaks, commonly denoted as resonation peaks. The reflection or transmission characteristic has spaced reflection or transmission maxima points providing a maximum reflection or transmission of an associated wavelength. The resonator characteristic thus has a plurality of spectral response peaks. The resonator characteristic can be either regular, meaning that its resonation frequencies are all spaced apart by a same value, being the periodicity, or irregular, meaning that there is no fixed spacing between its resonation frequencies. Irregularity can be a random pattern of resonation frequencies or some structured pattern. Such a characteristic can be obtained via sampled gratings, which exhibit a comb-shaped reflections or transmission spectrum or via the so-called super-gratings. The gratings or super-gratings can also be characterized as distributed reflectors or transmission sections.

In the following detailed description methods and devices using gratings and sampled or structured gratings are described. Sampled or structured gratings can be described as structures in a waveguide system, having a periodically broken short-period structure including short period stripped regions alternating with non-stripped regions. The super-gratings can be described as structures in a waveguide system having a diffractive grating having a plurality of repeating unit regions each having a constant length, thus forming a modulation period, and at least one parameter that determines the optical reflectivity or transmission of the diffractive grating varying depending on its position in each of the repeating unit regions along a direction of optical transmission in the laser, the diffractive grating extending by at least two modulation periods.

In the following detailed description methods and devices using gratings and chirped grating structures are described. A grating is any regularly spaced collection of essentially identical, parallel, elongated elements. Gratings usually consist of a single set of elongated elements, but can consist of two sets, in which case the second set is usually perpendicular to the first. A chirped grating is a structure with chirped spaces, i.e. spaces of varying depth designed to reflect varying wavelengths of lights. Chirped grating mirrors are used in lasers to reflect a wider range of light wavelengths than ordinary dielectric mirrors, or to compensate for the dispersion of wavelengths that can be created by some optical elements.

In the following description methods and devices using AWGs are described. Arrayed waveguide gratings are lightwave circuits that may be used as optical multiplexers or demultiplexers in optical systems such as wavelength division multiplexed (WDM) systems. AWGs are capable of multiplexing a large number of wavelengths into a single optical fiber, thereby increasing the transmission capacity of optical networks. AWGs may be planar lightwave circuits that may be fabricated by depositing doped and undoped layers of silica on a silicon or SiNx substrate.

In the following description methods and devices using optical transmission within the C Band are described. Optical fiber communications typically operate in a wavelength region corresponding to different "telecom windows". The C Band describes one such window that is very widely used and utilizes wavelengths around 1.5 µm (1530-1565 nm). The losses of silica fibers are lowest in this region, and erbium-doped fiber amplifiers and laser diodes are available which offer very high performance.

FIG. 1 shows a schematic diagram illustrating the architecture of a multi-channel tunable laser 100 according to an implementation form. The multi-channel tunable laser 100 includes a frequency selective optical multiplexer 101, a plurality of channel paths 105, an optional first optical tuner 2 and a plurality of second optical tuners 3. The frequency selective optical multiplexer 101 includes a plurality of channel terminals 103 for receiving/transmitting light, a plurality of channel waveguide blocks 104, each channel waveguide block 104 including at least one reflectively terminated 1 channel waveguide 4 and an optical coupling element 5 optically coupling the plurality of channel terminals 103 with the plurality of channel waveguide blocks 104. Each of the channel waveguides 4 of the plurality of channel waveguide blocks 104 has a different length. Each channel path 105 of the plurality of channel paths 105 is coupled to a respective channel terminal 103 of the plurality of channel terminals 103 and includes a gain element 7, a phase element 6 and a reflective element 8. The optional first optical tuner 2 may be used to tune the channel waveguides 4 of the plurality of channel waveguide blocks 104, in particular all channel waveguides 4. Each second optical tuner 3 of the plurality of second optical tuners 3 is configured to tune the channel waveguides 4 of a respective channel waveguide block 104 of the plurality of channel waveguide blocks 104. The first optical tuner 2 is optional because its functionality can be performed by the plurality of second optical tuners 3.

The frequency selective optical multiplexer 101 may include a half section of an arrayed waveguide grating multiplexer, e.g. as described below with respect to FIGS. 2 to 4. The reflective termination 1 of the at least one reflectively terminated channel waveguide 4 may be located outside of the optical coupling element 5. The reflective termination 1 of the at least one reflectively terminated channel waveguide 4 may include a reflective coating, a broadband grating, a mirror or some other reflective means. Both, the optional first optical tuner 2 and the plurality of second optical tuners 3 may be configured to modify a refractive index of the channel waveguides 4 based on Thermal tuning, Current injection, Voltage, Stress and/or some other tuning means. The plurality of second optical tuners 3 may be independently tunable. The optical coupling element 5 may include a free propagation region coupling the plurality of channel terminals 103 with the plurality of channel waveguide blocks 104 such that light beams travelling through the plurality of channel waveguide blocks 104 are constructively and destructively interfering in the free propagation region. The free propagation region may be designed such that a light beam tuned by one of the second optical tuners 3 is propagating through the free propagation region without interfering with a light beam tuned by another one of the second optical tuners 3.

The optical coupling element 5 may include a multi-star coupler. The multi-star coupler may be designed to couple a respective portion of the channel waveguides 4 to a respective channel terminal 103 of the plurality of channel terminals 103. The multi-star coupler may be designed based on a Rowland Circle. An angle of the Rowland circle may be designed such that light beams propagating through different channel terminals 103 of the plurality of channel terminals 103 do not interfere.

Both, the optional first optical tuner 2 and the second optical tuners 3 may be configured to tune the channel waveguides 4 so as to produce light of a single frequency in each of the channel paths 105. The optical tuners 2, 3 may be configured to tune the channel waveguides 4 so as to produce a different single frequency or to produce the same single frequency in each of the channel paths 105. Alternatively, the optical tuners 2, 3 may be configured to tune the channel waveguides 4 so as to produce light of a full predetermined range of frequencies in each of the channel paths 105.

The gain element 7 may generate a broad spectrum of light. The gain element 7 may couple the channel terminals 103 of the frequency selective optical multiplexer 101 with the reflective element 8. The phase element 6 may be coupled to the gain element 7. The phase element 6 may be configured to fine-tune the lasing mode of the respective channel path 105 to which the phase element 6 belongs and to offset a phase drift in the respective channel path 105 of the multi-channel tunable laser 100.

The second optical tuners 3 may be configured for discontinuous tuning by tuning one frequency comb generated by a first plurality of branches of the blocks of channel waveguides 3 while the other frequency comb generated by a second plurality of branches remains fixed as described below with respect to FIG. 16. The second optical tuners 3 may be configured for continuous tuning by tuning both of the frequency combs together as described below with respect to FIG. 17. The second optical tuners 3 may be configured to combine continuous tuning and discontinuous tuning as described below with respect to FIG. 15.

The reflective element 8 may include a broadband partial reflector section. The broadband partial reflector section may include a passive chirped grating section as described below with respect to FIG. 13.

The optical coupling element 5 may include a multi-star coupler. The optical coupling element 5 may include a free propagation region coupling the channel terminals 103 with the plurality of channel waveguide blocks 104 such that light beams travelling through the channel waveguide blocks 104 are constructively and destructively interfering in the free propagation region.

The multi-channel tunable laser 100 may be integrated together with a semiconductor optical amplifier on a chip.

The multi-channel tunable laser 100 may also be denoted as AWG multi-channel tunable laser as the frequency selective optical multiplexer may include half an AWG. The multi-channel tunable laser 100 may include a HR (highly reflective) reflection 1 as reflective termination to reflect the signal back into the AWG, doubling the effective AWG length. The frequency selective optical multiplexer 101 may include half an AWG to reduce the complexity, footprint and cost of the chip. In one exemplary embodiment, the multi-channel tunable laser 100 may include two second tuning elements each covering a half of the AWG branches. The second tuning elements 3 may be used for (thermal) wavelength tuning of the refractive index of the branches, thereby emulating two AWGs from one half of an AWG. The multi-channel tunable laser 100 may include a phase section or phase element 6. The multi-channel tunable laser 100 may include a gain element 7, e.g. gain chip or gain section. The multi-channel tunable laser 100 may include a reflective element 8, e.g. a passive chirped grating section serving as a broadband waveguide reflector.

The high reflection coating 1 at a first tail of the channel waveguides 4 may act as the cavity reflector for the lasing effect. This may be necessary for the lasing to occur. The second optical tuners 3 may tune groups of AWG branches over a selected frequency range, using the Vernier effect. These second optical tuners 3 may be thermal tuners, for example. The first optical tuner 2 may be used for tuning the whole set of AWG branches. The half Arrayed waveguide grating (AWG) provides the frequency comb effect as shown in the FIG. 5. The gain chip 7 and the phase block 6 may be required for generating the lasing effect and for fine tuning. A passive chirped grating of the reflective element 8 may be necessary for the lasing to occur. The AWG branches may provide a wavelength equal to 2 times the branch length times the index. Laser light may be emitted at the outputs of the channel paths 105.

Figure 5:
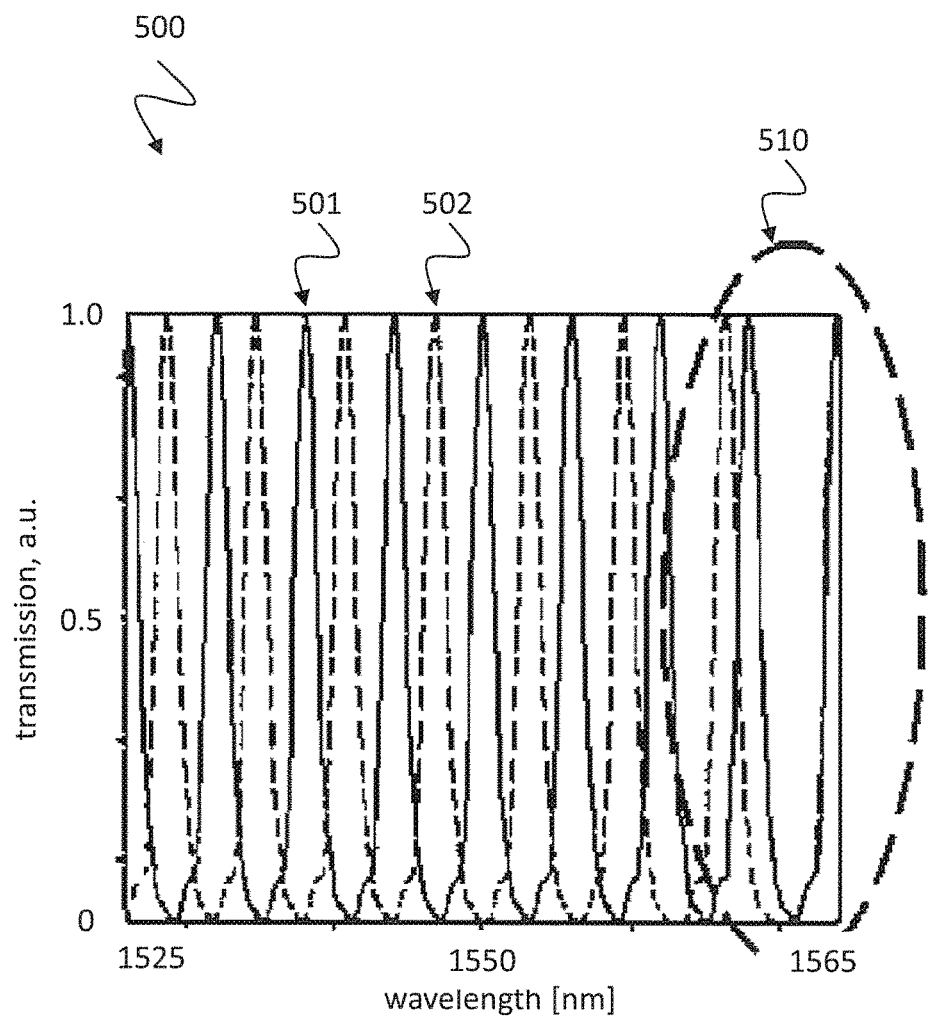
FIG. 5 shows a transmission diagram 500 illustrating constructive and destructive interference in two tunable combs of a frequency selective optical multiplexer according to an implementation form.

The gain chip 7 may generate a broad spectrum that travels between the high reflection coating 1 and the passive chirped grating 8. The passive chirped grating 8 may act as a broadband mirror reflecting some of the light back into the cavity formed by the elements 6, 7, 8 to ensure lasing action occurs. The AWG 101 may act as a frequency selective filter (de-multiplexer). The selected frequencies may be determined by the length of the AWG branches 4. A comb of frequencies may be generated by a number of branches of different path lengths. The two sets of combs may have different path length difference, to generate two frequency combs with different spacings. In the absence of tuners, the light reflected back from the HR coating 1 (or other reflective means) may interfere in the AWG's FRP (Free Propagation Region) 5 and the single selected frequency for each optical path 105 to lase is the result of constructive and destructive interference between the two frequency combs as shown in FIG. 5. The second tuners 3 may use thermal tuning to ensure narrow linewidth and low loss, however alternative tuning may be used too, such as current injection. In order to tune the device between two supermodes across the C-band, both or more of the second tuners 3 may be activated simultaneously.

The multi-channel tunable laser 100 may be designed to use half an arrayed waveguide grating (AWG) with high reflectivity (HR) coating and tuning to reflect the signal back into the AWG and tune the AWG branches and thereby the half AWG acts as two full AWGs. The second tuning elements 3 may tune the AWG branches, e.g. by applying thermal tuning, so as to create two AWGs out of the one while the HR coating 1 reduces the AWG to half the size. The AWG may act as an external cavity for the laser. All conventional tunable lasers that use AWGs use at least one full AWG. The passive chirped grating 8 may act as a waveguide reflector for broadband and enables laser integration with an SOA (semiconductor optical amplifier) that can connect to other devices such as modulators.

The half AWG reduces the footprint of the chip (chip real estate), reduces the complexity of the fabrication process and thereby reduces the chip cost. The laser 100 may make use of passive chirped grating as the reflective means 8, thereby enabling the multi-channel tunable laser 100 to be integrated to an SOA and then to other devices; e.g. Electro-Absorption Modulators (EAMs) and other modulators and devices.

The plurality of optical channel paths 105 of the multi-channel widely tunable laser 100 may share the free propagation region in the optical coupler 5, thereby reducing chip size, process complexity and chip cost. This also helps with chip integration.

Figure 2:
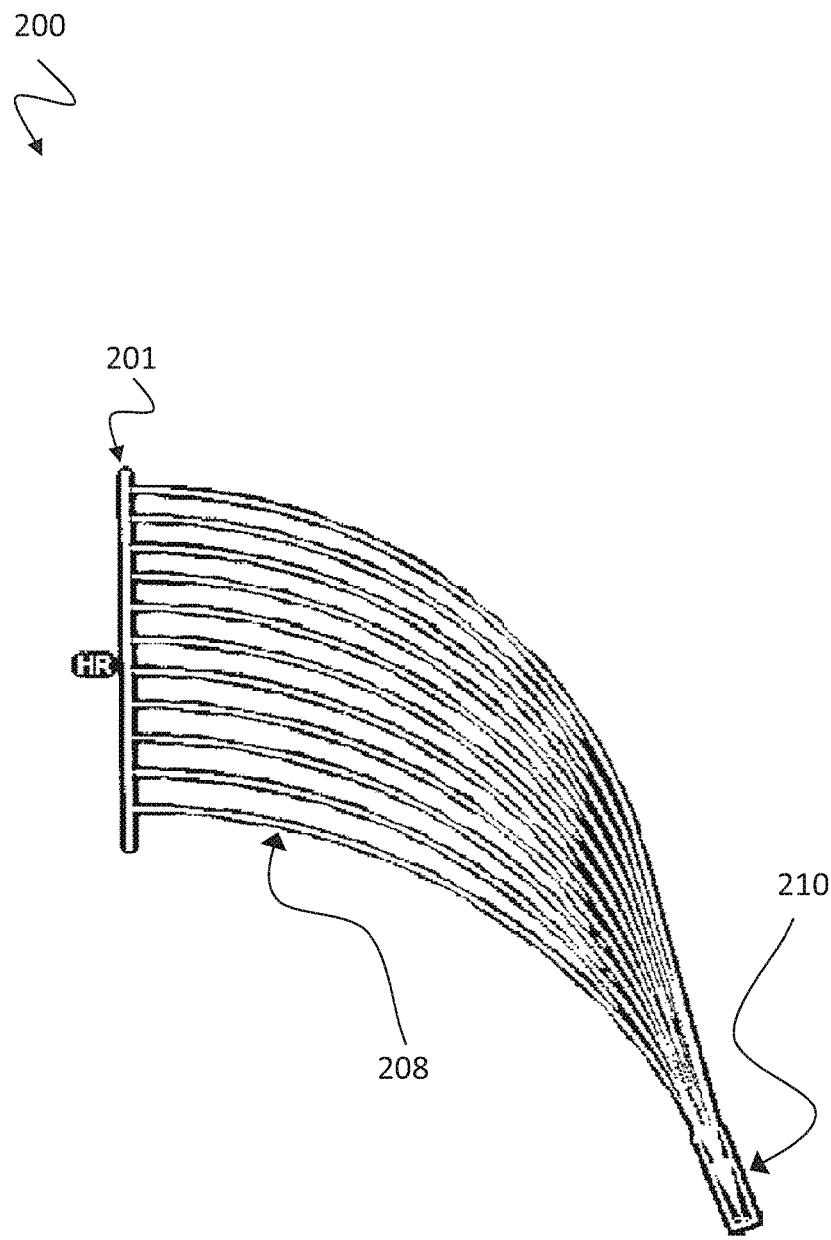
FIG. 2 shows a schematic diagram illustrating a frequency selective optical multiplexer 200 formed as half an AWG according to a first implementation form.

FIG. 2 shows a schematic diagram illustrating a frequency selective optical multiplexer 200 formed as half an AWG according to a first implementation form.

The half AWG 200 includes a first terminal 210 for receiving/transmitting light and a block or bundle of channel waveguides 208 coupled to the first terminal by an optical coupler, e.g. a star coupler. Each of the channel waveguides 208 is reflectively coated at a first tail of the half AWG 200, e.g. by a highly reflective (HR) coating 201. The half AWG 200 includes an optical coupling element where the first terminal is coupled to the block of channel waveguides at respective second tails of the channel waveguides 208. The reflective coating 201 at the first tails of the channel waveguides 208 may be a planar coating (as depicted in FIG. 2) or may be applied individually to each channel waveguide (not depicted in FIG. 2). Each of the channel waveguides 208 has a different length to facilitate propagation of different wavelengths in the channel waveguides 208. It is understood that any variations on the layout depicted in FIG. 2 are possible, for example multiple blocks of waveguides as shown below in FIGS. 3 and 4 and other designs not illustrated in the figures.

Figure 3:
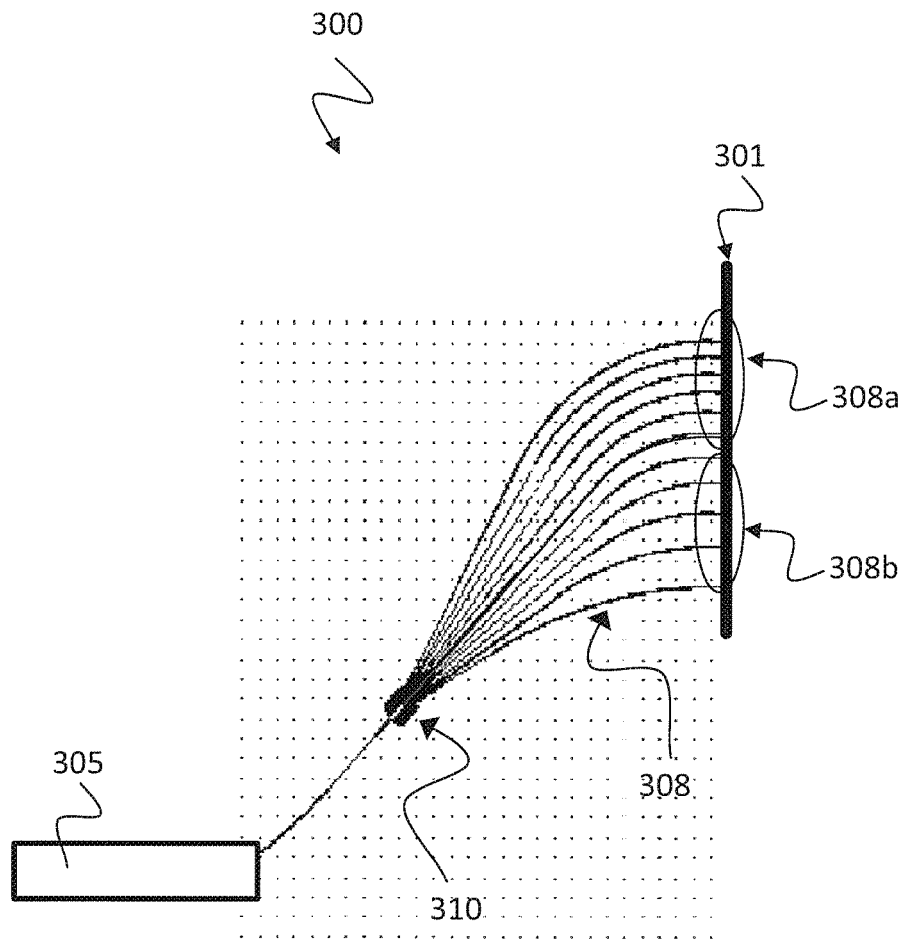
FIG. 3 shows a schematic diagram illustrating a frequency selective optical multiplexer 300 formed as half an AWG according to a second implementation form.

FIG. 3 shows a schematic diagram illustrating a frequency selective optical multiplexer formed as half an AWG 300 according to a second implementation form.

The half AWG 300 includes a first terminal 310 for receiving/transmitting light and two blocks 308a, 308b or bundles of channel waveguides 308 coupled to the first terminal 310 by an optical coupler, e.g. a star coupler. Each of the channel waveguides 308 of the respective block 308a, 308b of channel waveguides is reflectively coated at a first tail of the half AWG 300, e.g. by a highly reflective (HR) coating 301. The half AWG 300 includes an optical coupling element where the first terminal is coupled to the two blocks of channel waveguides at respective second tails of the channel waveguides 308. The reflective coating 301 at the first tails of the channel waveguides 308 may be a planar coating (as depicted in FIG. 3) or may be applied individually to each channel waveguide (not depicted in FIG. 3) or may be applied individually for each block 308a, 308b of channel waveguides 308. Each of the channel waveguides 308 has a different length to facilitate propagation of different wavelengths in the channel waveguides 308.

The waveguide length difference of the first block 308a of channel waveguides may be $\Delta L1$. The waveguide length difference of the second block 308b of channel waveguides may be $\Delta L2$. The tuning elements (not depicted in FIG. 3) may be electrodes that may be covered separately on the two blocks 308a, 308b of channel waveguides. The wavelength may be tuned by the reflective index change of the half array waveguide caused by current or voltage implied on the two electrodes of the respective block of channel waveguides. Alternatively, thermal tuning elements may be implemented.

A gain element 305 may be used to generate the light coupled into the half AWG 300.

The half AWG 300 may be produced in a planar waveguide technology.

Figure 4:
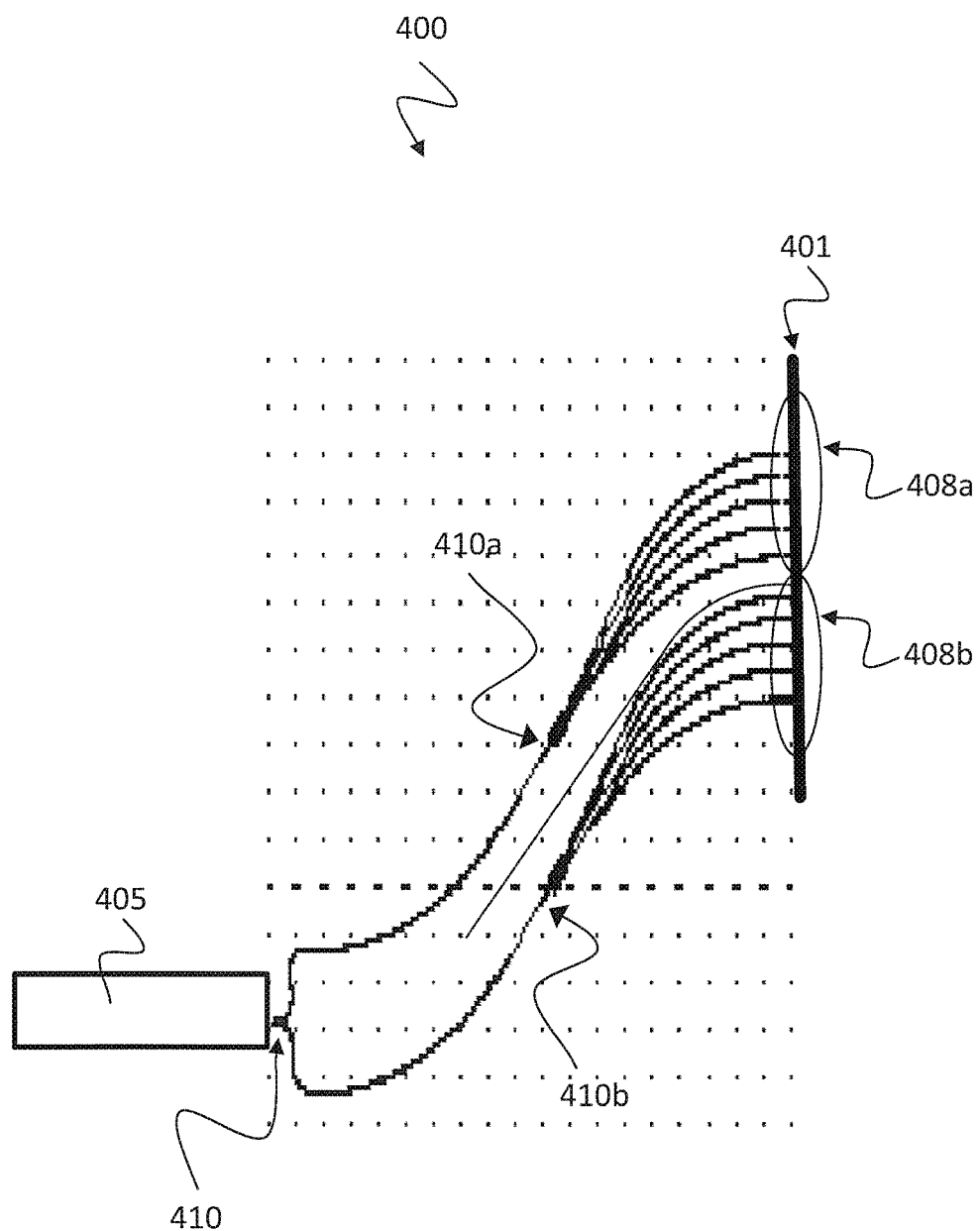
FIG. 4 shows a schematic diagram illustrating a frequency selective optical multiplexer 400 formed as half an AWG according to a third implementation form.

FIG. 4 shows a schematic diagram illustrating a frequency selective optical multiplexer formed as half an AWG 400 according to a third implementation form.

The half AWG 400 includes two blocks 408a, 408b or bundles of channel waveguides 408 each one coupled to a respective first terminal 410a, 410b by a respective optical coupler, e.g. a star coupler. Each block 408a, 408b of channel waveguides has its own optical coupler. Each of the channel waveguides 408 of the respective block 408a, 408b of channel waveguides is reflectively coated at a first tail of the half AWG 400, e.g. by a highly reflective (HR) coating 401. The half AWG 400 includes a first and a second optical coupling element. The first optical coupling element couples the first block 408a of channel waveguides 408 at their second tail to a first terminal 410a of the first block of channel waveguides. The second optical coupling element couples the second block 408b of channel waveguides 408 at their second tail to a first terminal 410b of the second block of channel waveguides. The first terminal 410a of the first block 408a of channel waveguides and the first terminal 410b of the second block 408b of channel waveguides are combined in a first terminal 410 of the frequency selective optical multiplexer 400 that is coupled to the gain element 405.

The reflective coating 401 at the first tails of the two blocks 408a, 408b of channel waveguides 408 may be a planar coating (as depicted in FIG. 4) or may be applied individually to each channel waveguide (not depicted in FIG. 3) or may be applied individually for each block 408a, 408b of channel waveguides 408. Each of the channel waveguides 408 has a different length to facilitate propagation of different wavelengths in the channel waveguides 408.

The waveguide length difference of the first block 408a of channel waveguides may be ΔL1. The waveguide length difference of the second block 408b of channel waveguides may be ΔL2. The two blocks 408a, 408b of channel waveguides 408 may be spaced apart from each other. The tuning elements (not depicted in FIG. 4) may be electrodes that may be covered separately on the two blocks 408a, 408b of channel waveguides. The wavelength may be tuned by the reflective index change of the half array waveguide caused by current or voltage implied on the two electrodes of the respective block of channel waveguides. Alternatively, thermal tuning elements may be implemented.

The gain element 405 may be used to generate the light coupled into the half AWG 400.

The half AWG 400 may be produced in a planar waveguide technology.

FIG. 5 shows a schematic diagram illustrating constructive and destructive interference in the two tunable combs of a frequency selective optical multiplexer according to an implementation form.

The diagram illustrates constructive and destructive interference from a first tuning element and a second tuning element by using the Vernier effect. The peaks of the first tuning element are illustrated by first peaks 501 in the spectrum and the peaks of the second tuning element are illustrated by second peaks 502 in the spectrum. At a specific wavelength section 510 in the spectrum the peaks 501, 502 of both tuning elements superimpose generating a supermode. The result of the constructive and destructive interference is illustrated in FIG. 6.

Figure 6:
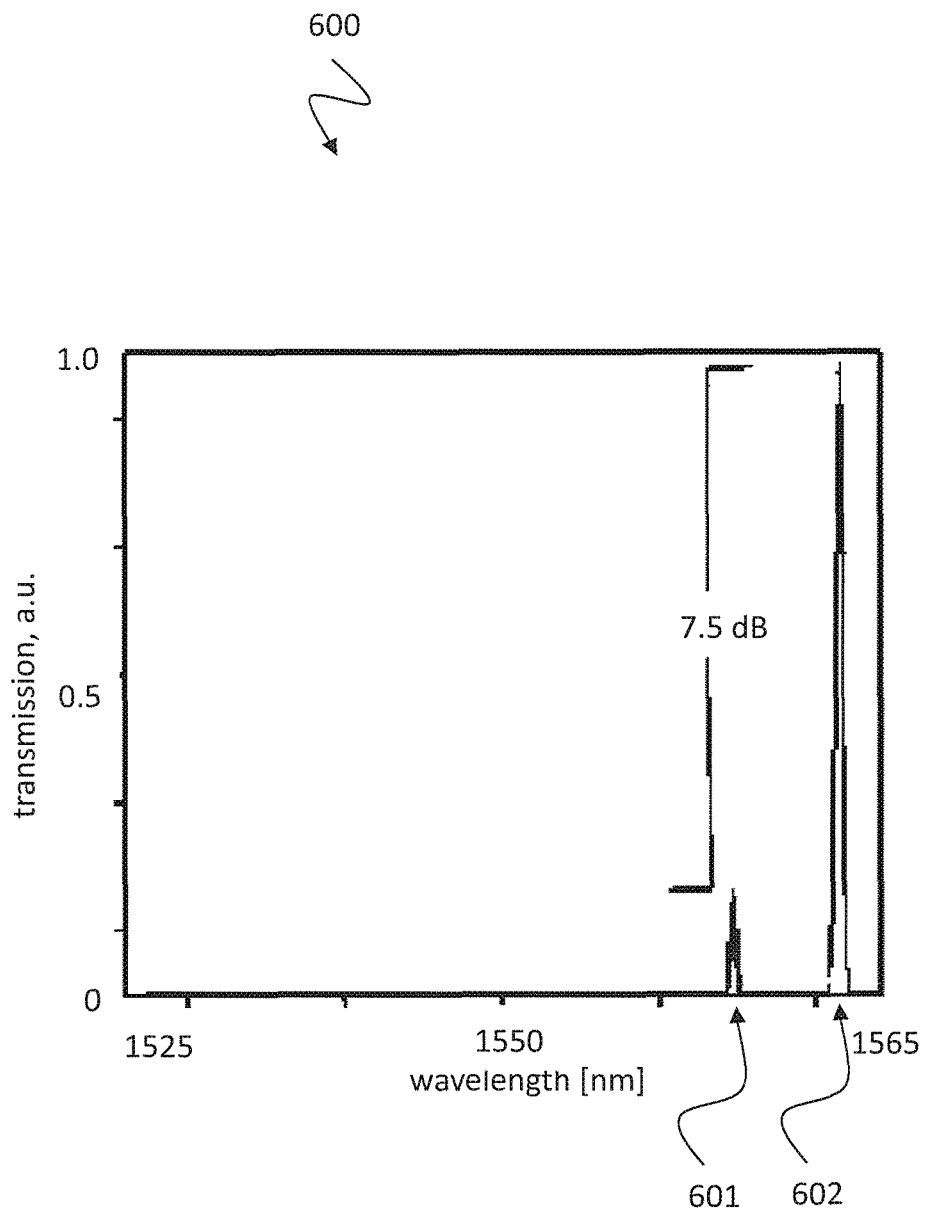
FIG. 6 shows a transmission diagram 600 illustrating the result of constructive and destructive interference of the spectra depicted in FIG. 5.

FIG. 6 shows a schematic diagram illustrating the result of constructive and destructive interference of the spectra depicted in FIG. 5. The resulting spectra including the constructive and destructive interferences shows a high main peak 602 and a smaller side peak 601.

Figure 7:
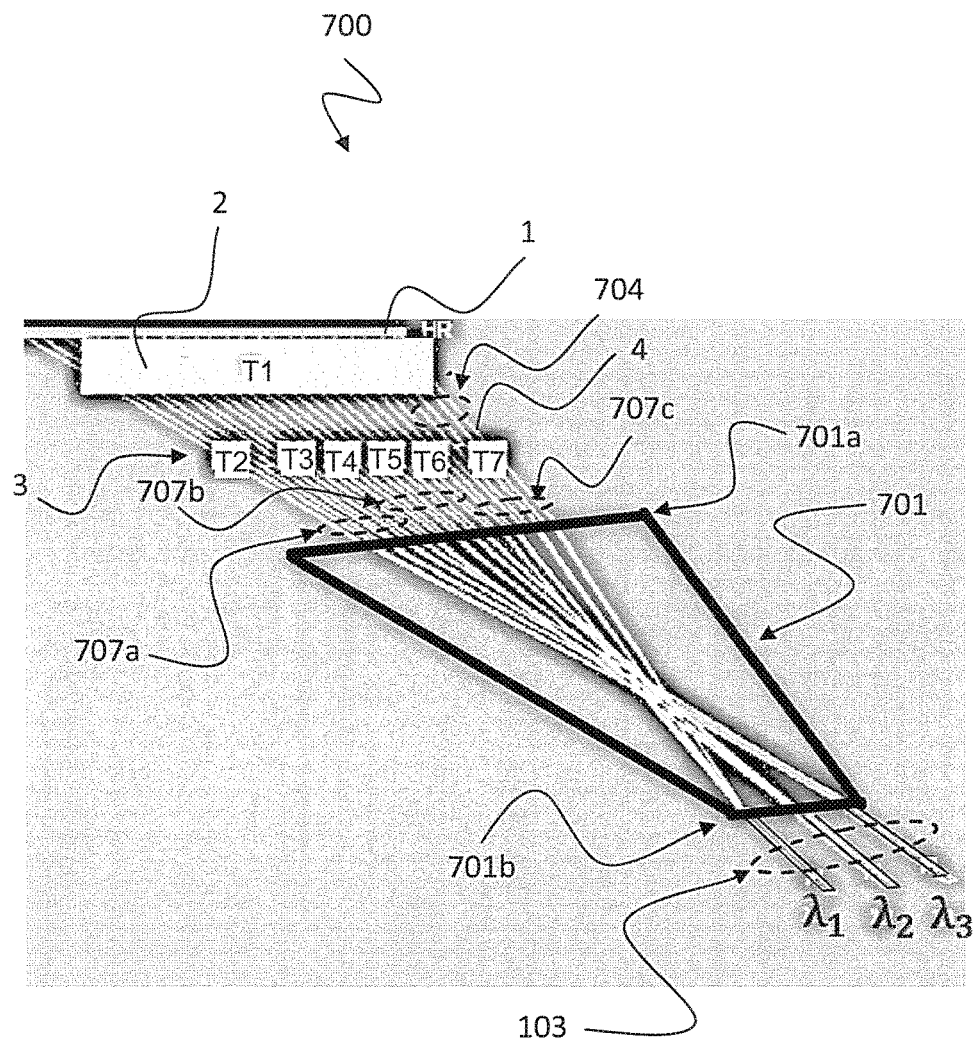
FIG. 7 shows a schematic diagram illustrating an architecture of a multi-channel tunable laser 700 including an optical coupler design based on a Rowland circle according to an implementation form.

FIG. 7 shows a schematic diagram illustrating an architecture of a multi-channel tunable laser 700 including an optical coupler design based on a Rowland circle according to an implementation form.

The multi-channel tunable laser 700 is similar to the multi-channel tunable laser 100 described above with respect to FIG. 1. The multi-channel tunable laser 700 includes a frequency selective optical multiplexer 701, a plurality of channel paths $\lambda_1$, $\lambda_2$, $\lambda_3$, a first optical tuner 2 and a plurality of second optical tuners 3. The frequency selective optical multiplexer 701 includes a plurality of channel terminals 103 for receiving/transmitting light, a plurality of channel waveguide blocks 704, each channel waveguide block 704 including at least one reflectively terminated 1 channel waveguide 4 and an optical coupling element 701 optically coupling the plurality of channel terminals 103 with the plurality of channel waveguide blocks 704. Each of the channel waveguides 4 of the plurality of channel waveguide blocks 704 has a different length. Each channel path $\lambda_i$ of the plurality of channel paths $\lambda_1$, $\lambda_2$, $\lambda_3$ is coupled to a respective channel terminal 103 of the plurality of channel terminals 103 and includes a gain element 7 (not depicted), a phase element 6 (not depicted) and a reflective element 8 (not depicted). The optional first optical tuner 2 may be used to tune the channel waveguides 4 of the plurality of channel waveguide blocks 704. Each second optical tuner 3 of the plurality of second optical tuners 3 is configured to tune the channel waveguides 4 of a respective channel waveguide block 704 of the plurality of channel waveguide blocks 704. The first optical tuner 2 is optional because its functionality may be performed by the second optical tuners 3.

As can be seen from FIG. 7, an exemplary number of twenty-four waveguides 4 is tuned by the first optical tuner 2 and by an exemplary number of six second optical tuners 3. One channel waveguide block 704 may include an exemplary number of four waveguides 4. In this exemplary configuration a first waveguide block 704 may be tuned by a first second tuner T2; a second waveguide block 704 may be tuned by a second tuner T3; a third waveguide block 704 may be tuned by a third second tuner T4; a fourth waveguide block 704 may be tuned by a fourth second tuner T5; a fifth waveguide block 704 may be tuned by a fifth second tuner T6; and a sixth waveguide block 704 may be tuned by a sixth second tuner T7. All waveguides 4 may additionally be tuned by the first tuner 2. Any other numbers can be used for assigning waveguides 4 to waveguide blocks 704, number of waveguides 4, number of second tuners 3, number of waveguide blocks 704.

The optical coupling element 701 optically couples the channel waveguide blocks 704 to channel terminals 103 each on associated with a channel path $\lambda_1$, $\lambda_2$, $\lambda_3$. In the exemplary configuration of FIG. 7 the number of channel waveguide blocks 704 is e.g. six while the number of channel paths $\lambda_1$, $\lambda_2$, $\lambda_3$ is e.g. three. In one implementation form (depicted in FIG. 7) the number of channel waveguide blocks 704 may be larger than the number of channel paths $\lambda_1$, $\lambda_2$, $\lambda_3$. In another implementation form (not depicted in FIG. 7) the number of channel waveguide blocks 704 may be equal or smaller than the number of channel paths $\lambda_1$, $\lambda_2$, $\lambda_3$.

In the exemplary configuration of FIG. 7 an exemplary number of two channel waveguide blocks 704 may be combined to form one superior channel waveguide block 707a, 707b, 707c which is coupled by the optical coupling element 701 to one channel path. In the exemplary configuration of FIG. 7 a first superior channel waveguide block 707a is coupled to a first channel path $\lambda_1$, a second superior channel waveguide block 707b is coupled to a second channel path $\lambda_2$ and a third superior channel waveguide block 707c is coupled to a third channel path $\lambda_3$.

The optical coupling element 701 may include a multi-star coupler. The multi-star coupler may include a plurality of star couplers, each one coupling a superior channel waveguide block to a respective channel path. In the exemplary configuration of FIG. 7 the multi-star coupler includes an exemplary number of three star couplers. A first star coupler couples the first superior channel waveguide block 707a to the first channel path $\lambda_1$, A second star coupler couples the second superior channel waveguide block 707b to the second channel path $\lambda_2$ and a third star coupler couples the third superior channel waveguide block 707c to the third channel path $\lambda_3$.

The optical coupling element 701 may include a free propagation region coupling the plurality of channel terminals 103 associated with the optical paths with the plurality of superior channel waveguide blocks 707a, 707b, 707c such that light beams travelling through the plurality of superior channel waveguide blocks 707a, 707b, 707c are constructively and destructively interfering in the free propagation region. The free propagation region may be designed such that a light beams propagating through one of the superior channel waveguide blocks 707a, 707b, 707c is propagating through the free propagation region without interfering with a light beam propagating through another one of the superior channel waveguide blocks 707a, 707b, 707c.

In the exemplary configuration of FIG. 7 the optical coupling element 701, in particular the free propagation region of the optical coupling element 701 is designed based on a Rowland circle 701a, 701b. The Rowland circle may be designed such that two frequency elements share a single output.

The Rowland circle 701a, 701b is a circle having the radius of curvature of a concave diffraction grating 701a as diameter. The Rowland circle has the property that, if a slit is placed anywhere on the circumference of the Rowland circle, the spectra of various orders are formed in exact focus also round the circumference of the Rowland circle. Hence, the multi-channel laser can very efficiently and accurately couple out the optical channel paths $\lambda_1$, $\lambda_2$, $\lambda_3$.

Figure 8A:
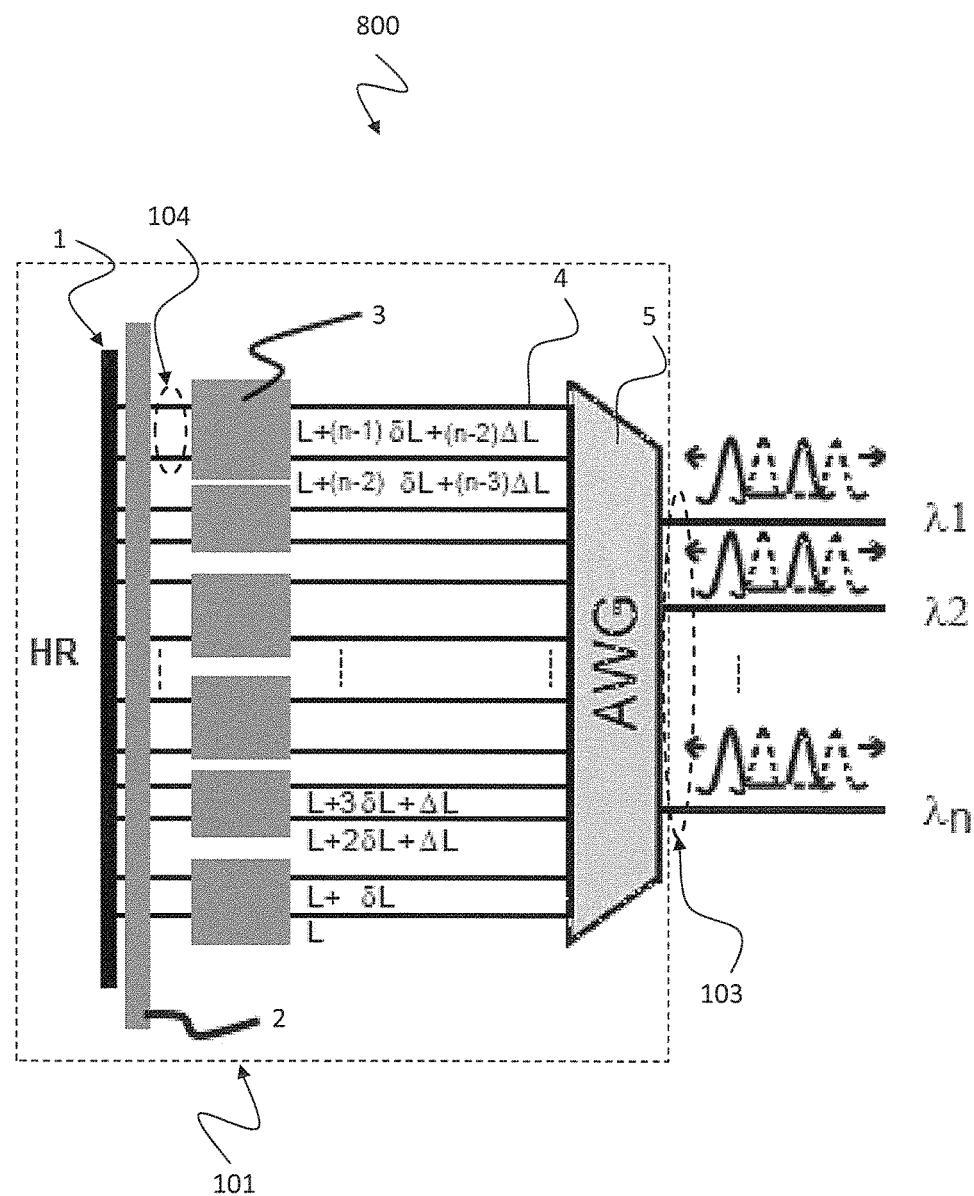
FIG. 8a shows a schematic diagram illustrating an architecture of a multi-channel tunable laser 800 where each channel path covers a limited wavelength range according to an implementation form.

FIG. 8a shows a schematic diagram illustrating an architecture of a multi-channel tunable laser 800 where each channel path covers a limited wavelength range according to an implementation form.

The multi-channel tunable laser 800 is similar to the multi-channel tunable laser 100 and the multi-channel laser 700 described above with respect to FIGS. 1 and 7. The multi-channel tunable laser 800 includes a frequency selective optical multiplexer 101, a plurality of channel paths $\lambda_1$, $\lambda_2$, ..., $\lambda_n$, an optional first optical tuner 2 and a plurality of second optical tuners 3. The frequency selective optical multiplexer 101 may form half an AWG as described above with respect to FIG. 1. The frequency selective optical multiplexer 101 includes a plurality of channel terminals 103 for receiving/transmitting light, a plurality of channel waveguide blocks 104, each channel waveguide block 104 including at least one high-reflectively (HR) terminated 1 channel waveguide 4 and an optical coupling element 5 optically coupling the plurality of channel terminals 103 with the plurality of channel waveguide blocks 104. Each channel path $\lambda_i$ of the plurality of channel paths $\lambda_1$, $\lambda_2$, $\lambda_3$ is coupled to a respective channel terminal 103 of the plurality of channel terminals 103 and may include a gain element 7 (not depicted), a phase element 6 (not depicted) and a reflective element 8 (not depicted). The optional first optical tuner 2 may be used to tune the entire channel waveguides 4 of the plurality of channel waveguide blocks 104, i.e. the entire frequency comb for the full frequency range. Each second optical tuner 3 of the plurality of second optical tuners 3 is configured to tune the channel waveguides 4 of a respective channel waveguide block 104 of the plurality of channel waveguide blocks 704, i.e. to tune individual super-modes for samples of the frequency range.

Each of the channel waveguides 4 of the plurality of channel waveguide blocks 104 has a different length. A base length of the channel waveguides 4 can be denoted as L and a length difference of two consecutive channel waveguide 4 can be denoted as $\Delta L$. The length variation caused by differential tuning of the second optical tuners 3 can be denoted as $\delta L$. Then, in the exemplary configuration of FIG. 8a a first channel waveguide 4 may have a length of $L+(n-1)\cdot\delta L+(n-2)\cdot\Delta L$, a second channel waveguide 4 may have a length of $L+(n-2)\cdot\delta L+(n-3)\cdot\Delta L$, a fourth to last channel waveguide 4 may have a length of $L+3\cdot\delta L+\Delta L$, a third to last channel waveguide 4 may have a length of $L+2\cdot\delta L+\Delta L$, a second to last channel waveguide 4 may have a length $L+\Delta L$ and a last channel waveguide 4 may have a length of L.

In the following, the principle of operation of the multi-channel tunable laser 800 is described. Half of the branches of the AWG may use differential tuning to generate the frequency comb, i.e. the difference in length between the adjacent arms generates the comb. The small electrodes (of the plurality of second optical tuners 3 depicted in FIG. 8a) may tune a sample of the frequency range. This may use thermal tuning. This tuning enables moving the super-mode across the selected frequency range, e.g. a 5 nm range. The large electrode (of the first optical tuner 2 depicted in FIG. 8a) may cover all or some of the branches and may be used to thermally tune the entire response over the full frequency range, e.g. the C-band. The lasing may occur in all outputs or in selected inputs where the final outputs may be selected via thermal tuning of the above mentioned electrodes. Of course another tuning method, e.g. as described above with respect to FIG. 1, may be used by the optical tuners 2, 3. The passive chirped grating may be designed such that each branch 4 in the array covers a limited (5 nm) wavelength range.

Figure 8B:
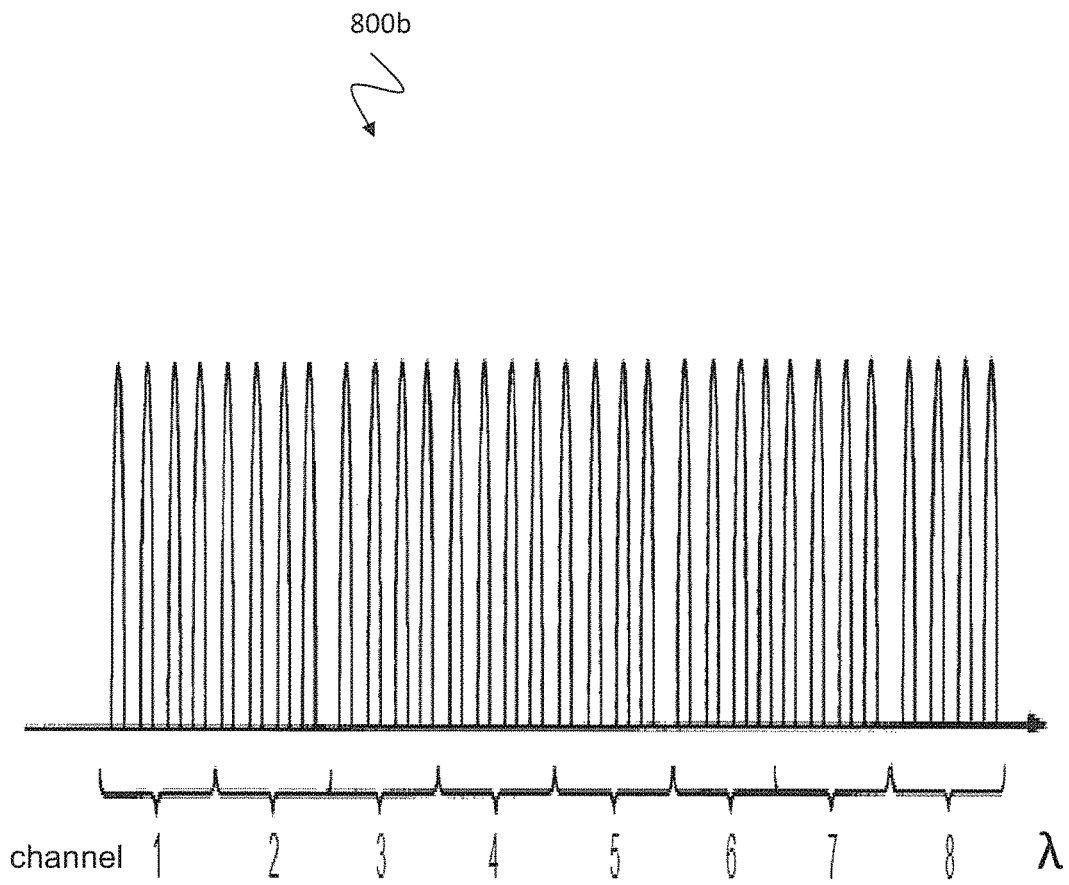
FIG. 8b shows a schematic diagram 800b illustrating the limited wavelength range of the multi-channel tunable laser 800 of FIG. 8a for a number of eight channels.
Figure 8C:
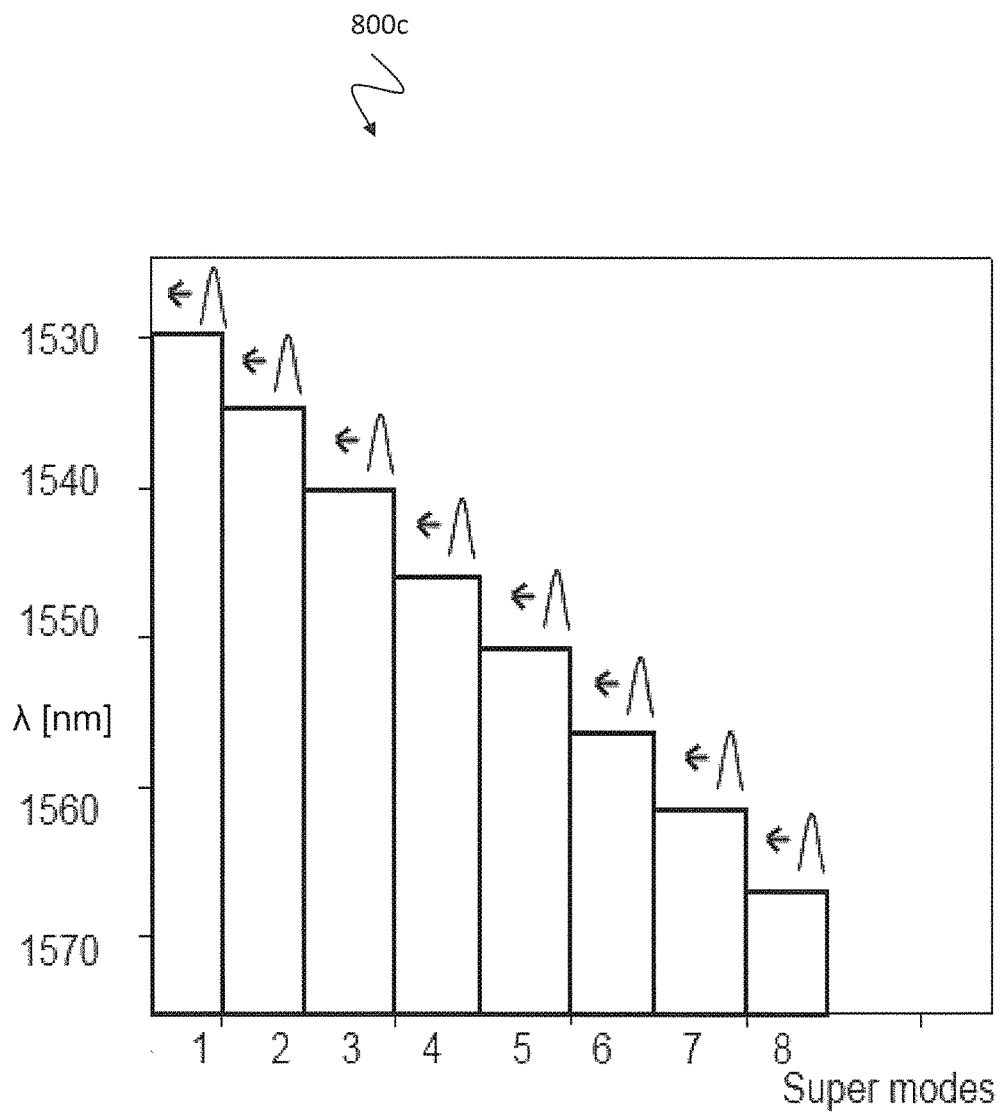
FIG. 8c shows a schematic diagram 800c illustrating occurrence of supermodes in the eight channels depicted in FIG. 8b.

FIG. 8b shows a schematic diagram 800b illustrating the limited wavelength range of the multi-channel tunable laser 800 of FIG. 8a for a number of eight channels and FIG. 8c shows a schematic diagram 800c illustrating occurrence of supermodes in the eight channels depicted in FIG. 8b occurring in the C-band with a wavelength range between 1530 nm and 1565 nm.

Figure 9A:
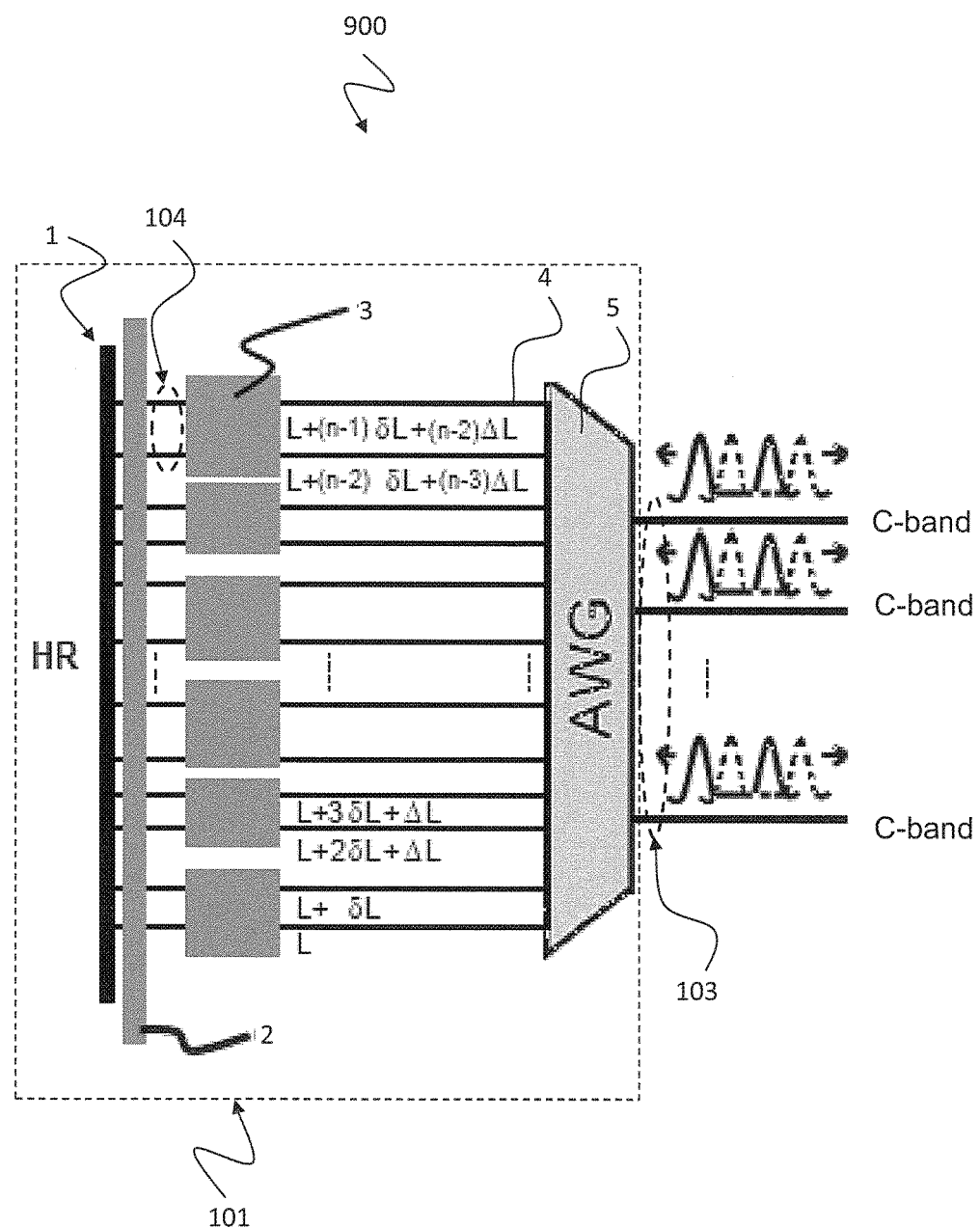
FIG. 9a shows a schematic diagram illustrating an architecture of a multi-channel tunable laser 900 where each channel path covers a full wavelength range according to an implementation form.

FIG. 9a shows a schematic diagram illustrating an architecture of a multi-channel tunable laser 900 where each channel path covers a full wavelength range according to an implementation form;

The multi-channel tunable laser 900 corresponds to the multi-channel tunable laser 800 described above with respect to FIG. 8a beside the implementation of the passive chirped grating of the reflective element 8. The passive chirped grating may be designed such that each branch 4 in the array covers the full wavelength range, e.g. the C-Band.

In the following, the principle of operation of the multi-channel tunable laser 900 is described. Half of the branches of the AWG may use differential tuning to generate the frequency comb, i.e. the difference in length between the adjacent arms generates the comb. The small electrodes (of the plurality of second optical tuners 3 depicted in FIG. 8a) may tune a sample of the frequency range. This may use thermal tuning. This tuning enables moving the super-mode across the selected frequency range, e.g. the C-band. The large electrode (of the first optical tuner 2 depicted in FIG. 8a) may cover all or some of the branches and may be used to thermally tune the entire response over the full frequency range, e.g. the C-band. The lasing may occur in all outputs or in selected inputs where the final outputs may be selected via thermal tuning of the above mentioned electrodes. Of course another tuning method, e.g. as described above with respect to FIG. 1, may be used by the optical tuners 2, 3. The passive chirped grating may be designed such that each branch 4 in the array covers the full wavelength range, e.g. the C-band.

Figure 9B:
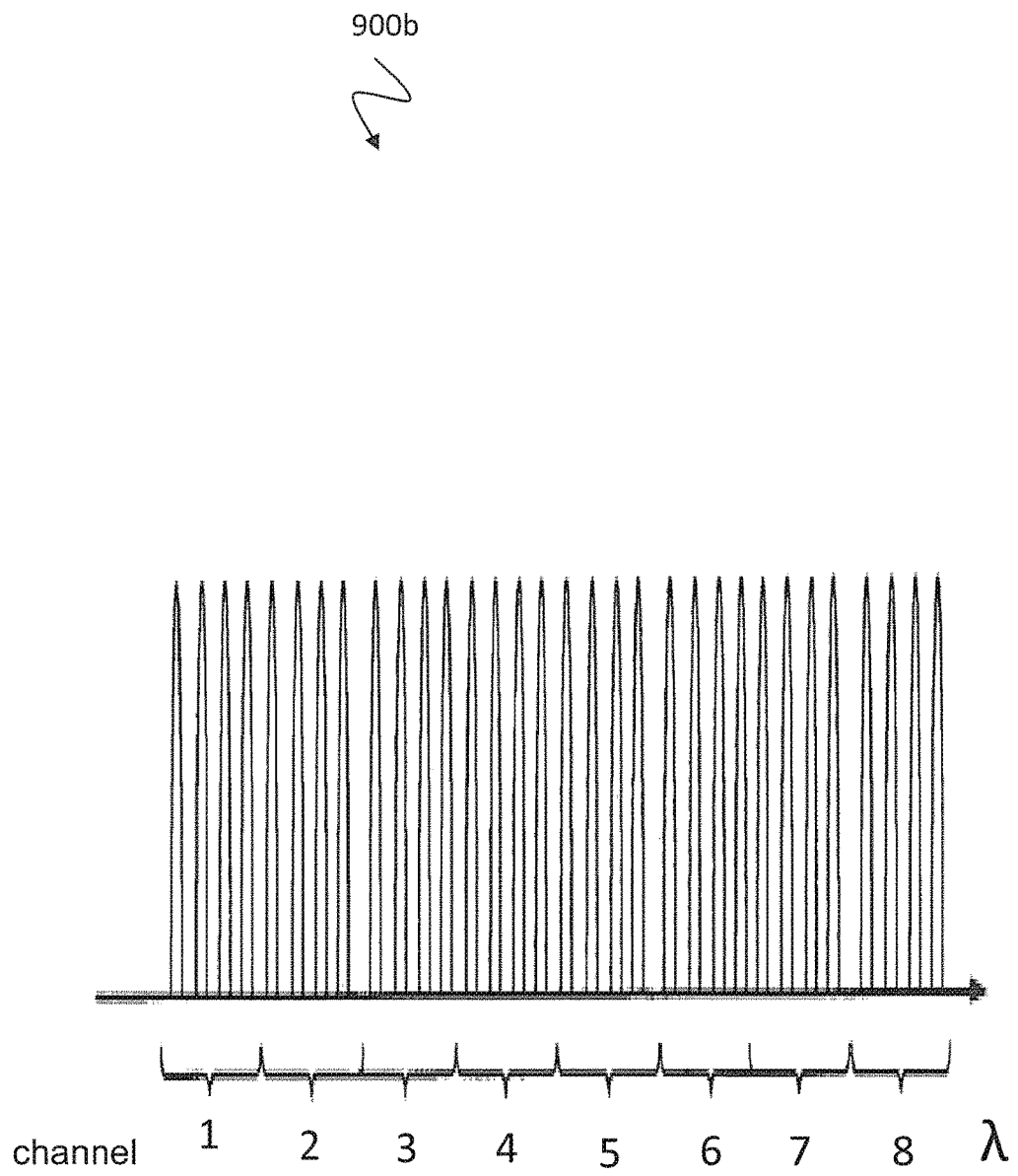
FIG. 9b shows a schematic diagram illustrating the full wavelength range of the multi-channel tunable laser 900 of FIG. 9a for a number of eight channels.

FIG. 9b shows a schematic diagram illustrating the full wavelength range of the multi-channel tunable laser 900 of FIG. 9a for a number of eight channels.

The Rowland circle for the Free Propagation Region of the frequency selective optical multiplexer 101 can be designed in different ways to ensure correct frequency control per output. This can be done by using type 1 techniques as described below with respect to FIGS. 10a and 10b or by using type 2 techniques as described below with respect to FIGS. 11a and 11b.

Figure 10A:
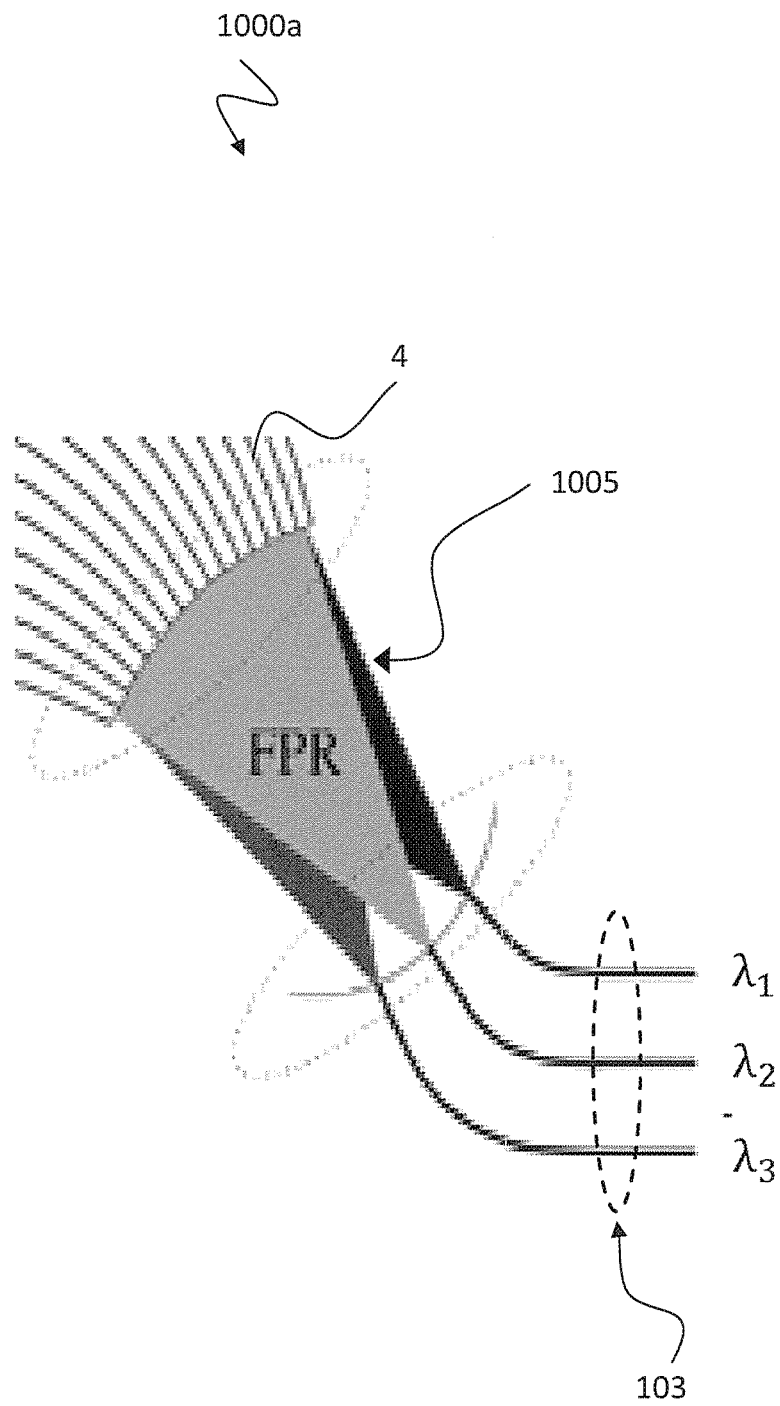
FIG. 10a shows a schematic diagram illustrating an optical coupler design 1000a based on the Rowland circle for single frequencies per branch according to a first implementation form.

FIG. 10a shows a schematic diagram illustrating an optical coupler design 1000a based on the Rowland circle for single frequencies per branch according to a first implementation form. The optical coupler 1000a may correspond to the optical coupling element 701 as described above with respect to FIG. 7. As can be seen from FIG. 10a the optical coupler 1000a couples waveguides 4 to the channel terminals 103 associated with the channel paths $\lambda_1$, $\lambda_2$, $\lambda_3$.

The wavelengths of the channel paths $\lambda_1$, $\lambda_2$, $\lambda_3$ may be selected by tuning the appropriate branches and designing the angle on the Rowland circle such that the outputs do not interfere and that each pair of tuned wavelengths propagate to their corresponding AWG output through the slab of the free propagation region 1005 without interfering with other tuned pairs. This characteristic may also be referred to as basic AWG function as shown in FIGS. 10a and 10b.

Figure 10B:
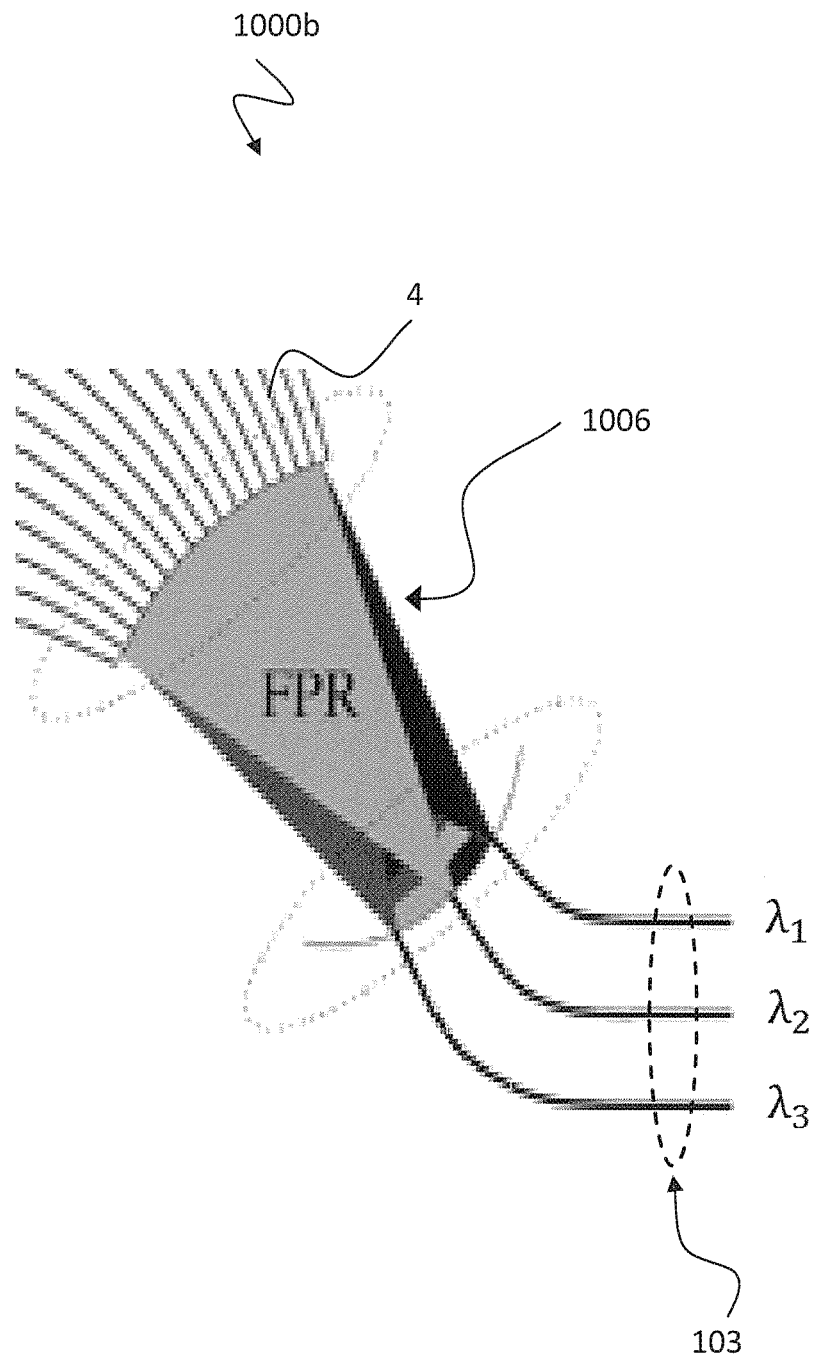
FIG. 10b shows a schematic diagram illustrating an optical coupler design 1000b based on the Rowland circle for single frequencies per branch according to a second implementation form.

FIG. 10b shows a schematic diagram illustrating an optical coupler design 1000b based on the Rowland circle for single frequencies per branch according to a second implementation form. The optical coupler 1000b may correspond to the optical coupler 1000a described above with respect to FIG. 10a, however, each pair of tuned wavelengths may propagate to more than one AWG output through the slab of the free propagation region 1006.

Figure 11A:
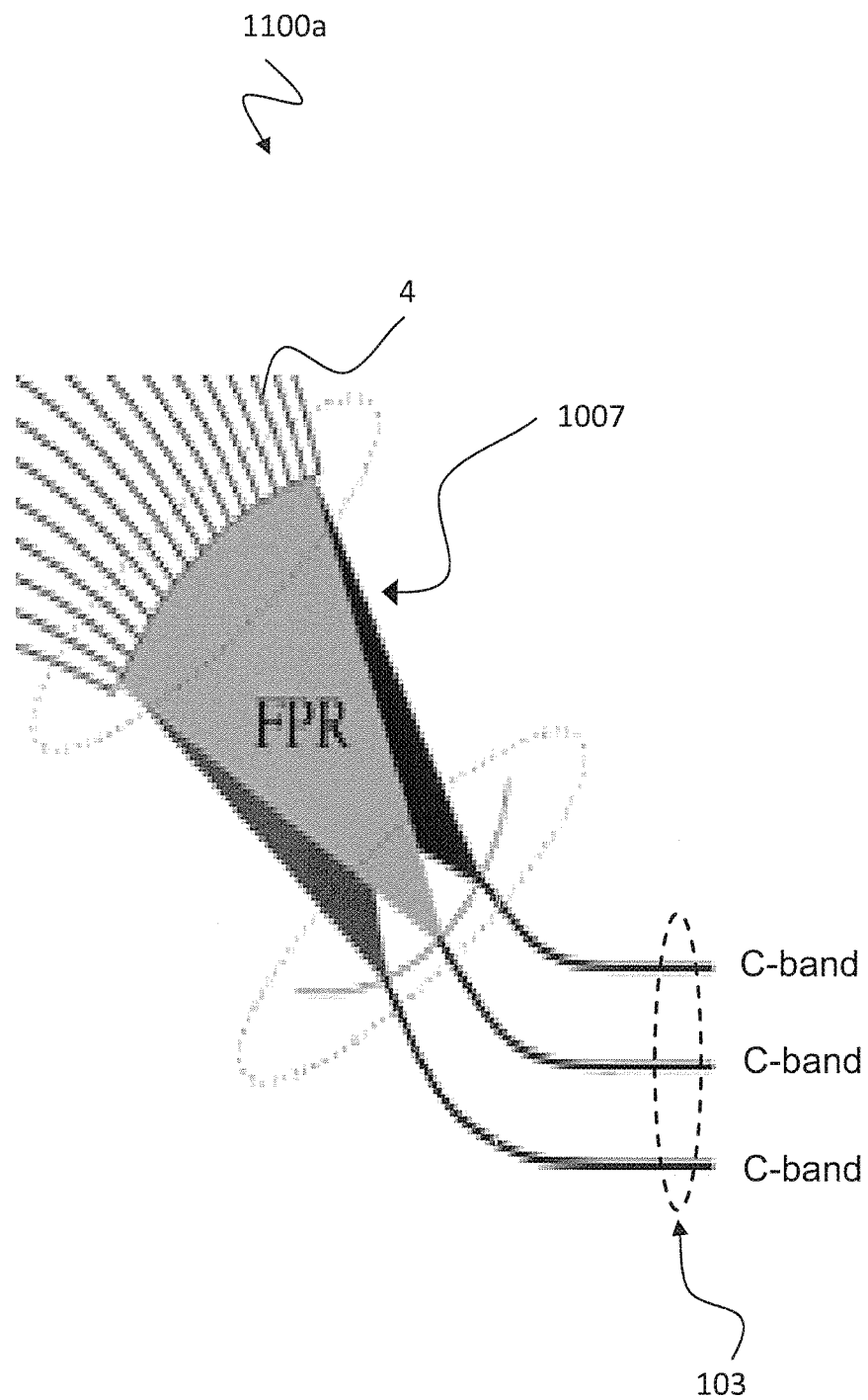
FIG. 11a shows a schematic diagram illustrating an optical coupler design 1100a based on the Rowland circle for C-band frequencies per branch according to a first implementation form.

FIG. 11a shows a schematic diagram illustrating an optical coupler design 1100a based on the Rowland circle for C-band frequencies per branch according to a first implementation form. The optical coupler 1100a may correspond to the optical coupling element 701 as described above with respect to FIG. 7. As can be seen from FIG. 11a the optical coupler 1100a couples waveguides 4 to the channel terminals 103 each channel terminal 103 associated with one channel paths of a whole C-band wavelength range.

The wavelengths cover the full wavelength range, e.g. the C-band. This may be achieved by having multiple AWGs within the half AWG, such that each section produces the full range of frequencies at the output by designing multiple tuning branches that share the same slab region and do not interfere in the free propagation region 1008 by carefully selecting the angle on the Rowland circle, as shown in FIGS. 11a and 11b.

Figure 11B:
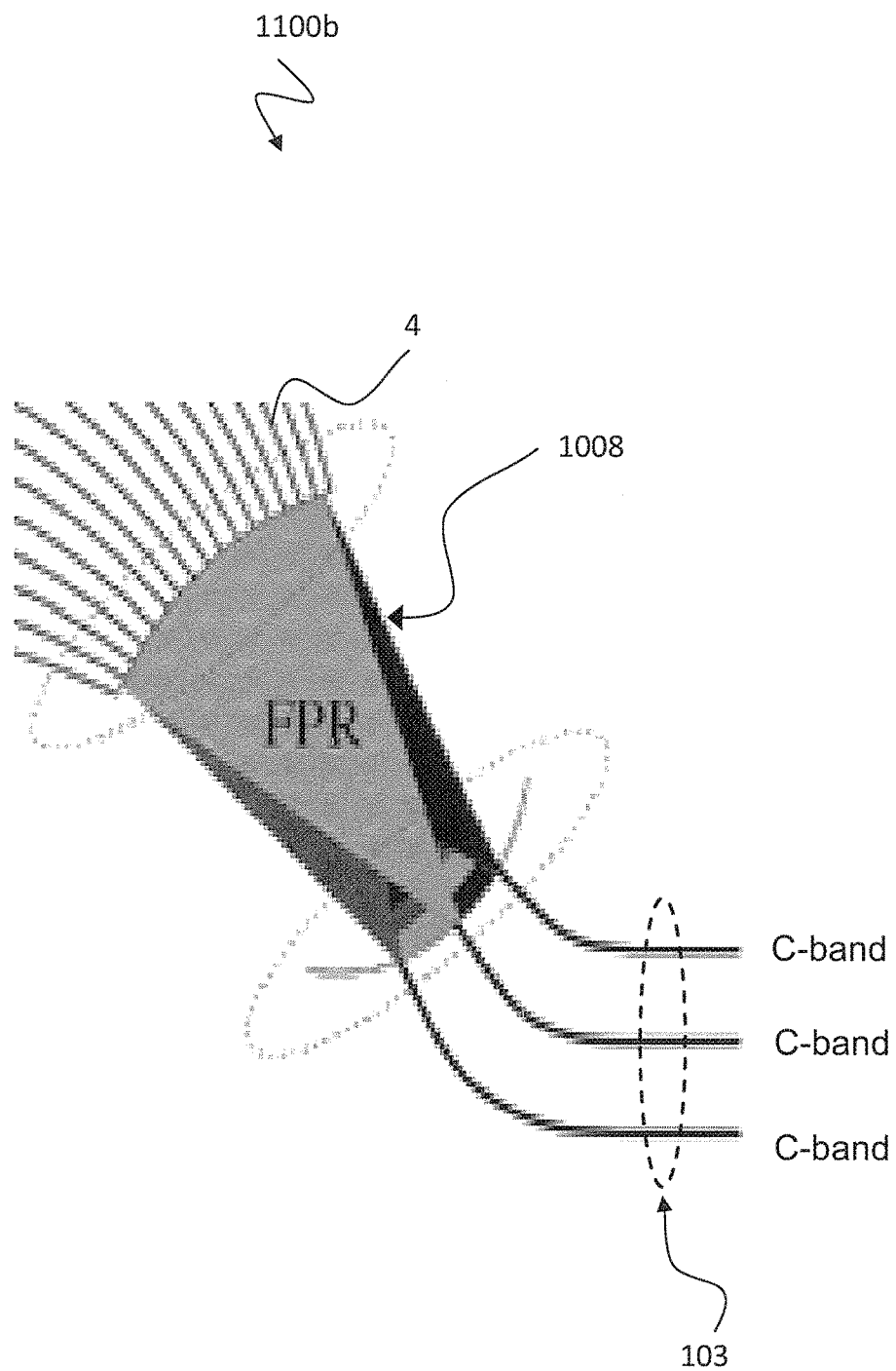
FIG. 11b shows a schematic diagram illustrating an optical coupler design 1100b based on the Rowland circle for C-band frequencies per branch according to a second implementation form.

FIG. 11b shows a schematic diagram illustrating an optical coupler design 1100b based on the Rowland circle for C-band frequencies per branch according to a second implementation form.

The optical coupler 1100b may correspond to the optical coupler 1100a described above with respect to FIG. 11a, however, each pair of tuned wavelengths may propagate to more than one AWG output through the slab of the free propagation region 1008.

Figure 12:
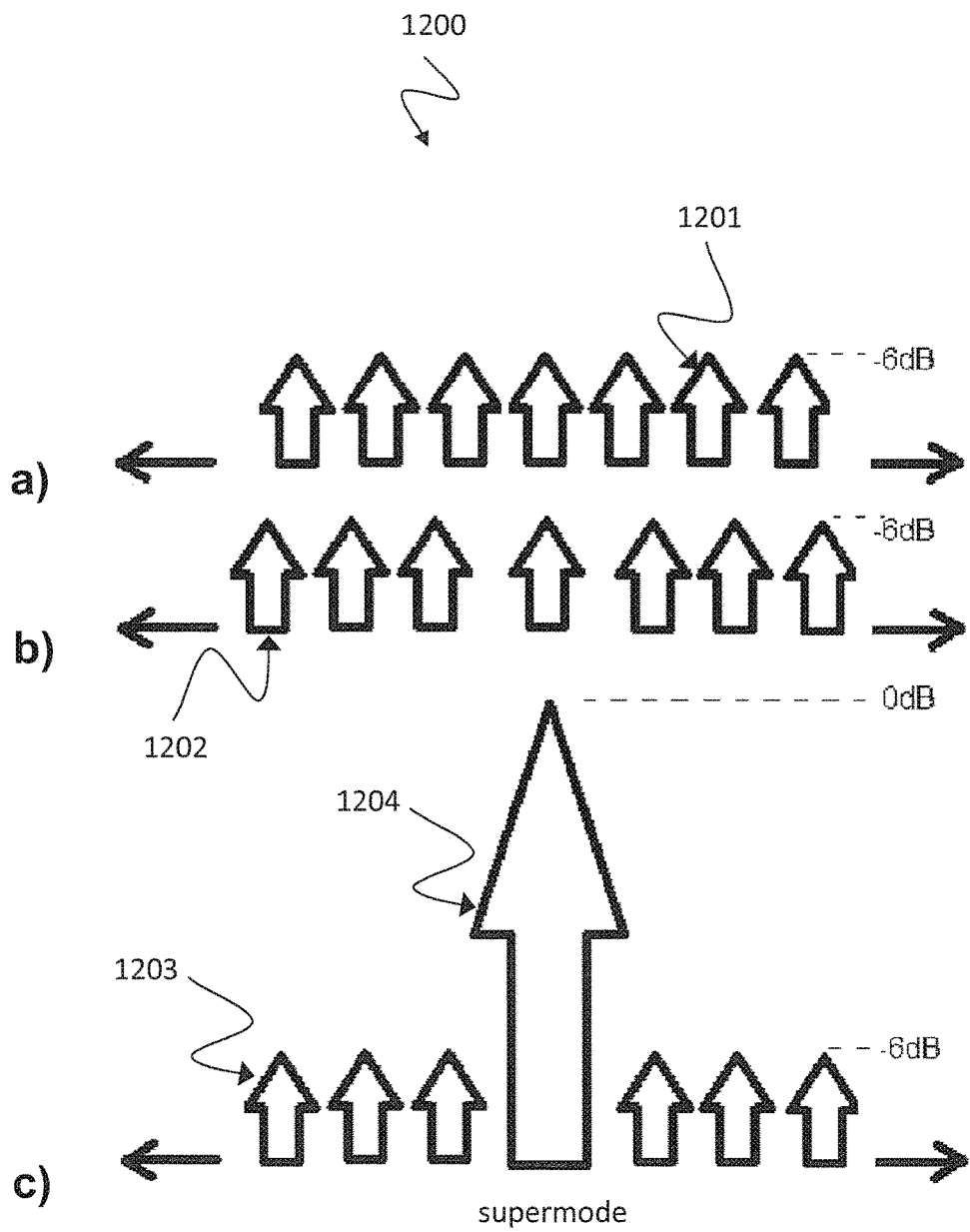
FIG. 12 shows a schematic diagram 1200 illustrating frequency selectivity of half an AWG with tuners creating a supermode out of the constructive interference between two aligned modes according to an implementation form.

FIG. 12 shows a schematic diagram 1200 illustrating frequency selectivity of half an AWG with tuners creating a supermode out of the constructive interference between two aligned modes according to an implementation form. First peaks 1201 (depicted in FIG. 12a) tuned by a tuning element have a different phase but a similar power than second peaks (depicted in FIG. 12b) 1202 tuned by another tuning element, for example different ones of the second optical tuners described above with respect to FIG. 1. A superimposition of the first peaks 1201 and the second peaks 1202 in the optical combiner of the half AWG results in constructive and destructive interference resulting in generation of supermodes 1204 and inferior cavity modes 1203. These supermodes 1204 occur with a larger period (i.e. smaller frequency) than a period with which the inferior cavity modes 1203 occur.

Figure 13:
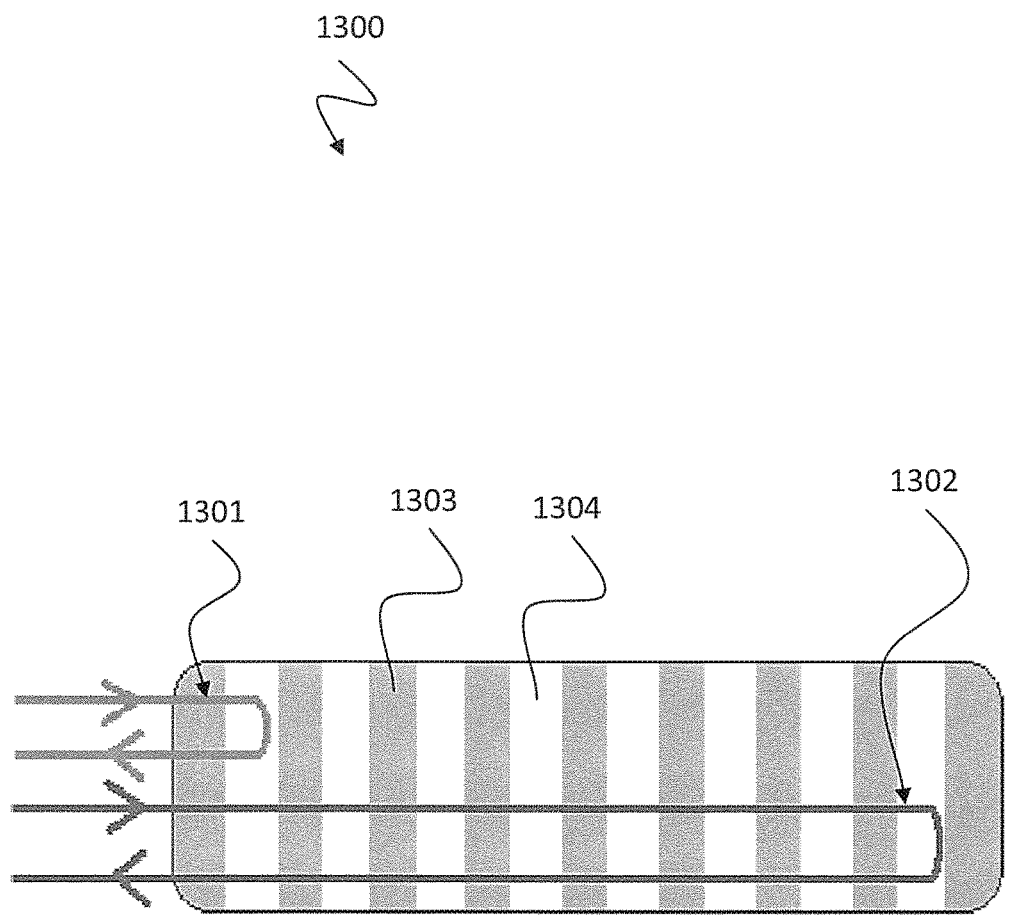
FIG. 13 shows a passive chirped grating 1300 used as reflective termination of the channel waveguides of a multi-channel tunable laser according to an implementation form.

FIG. 13 shows a passive chirped grating 1300 used as reflective termination of the channel waveguides of a multi-channel tunable laser according to an implementation form, e.g. as described above with respect to FIG. 1. The grating 1300 may be implemented as a structure of parallel stripes 1303, 1304 as depicted in FIG. 13. The passive chirped grating 1300 makes that light of a shorter wavelength 1301 intrudes less into the grating 1300 than light of a longer wavelength 1302 before it is reflected.

Alternatively, the passive chirped grating 1300 may have a periodically broken short-period structure including short period stripped regions alternating with non-stripped regions. The passive chirped grating 1300 may include supergratings that are structures having a diffractive grating with a plurality of repeating unit regions each of a constant length, thus forming a modulation period, and at least one parameter that determines the optical reflectivity or transmission of the diffractive grating. The at least one parameter may vary depending on its position in each of the repeating unit regions along a direction of optical transmission in the laser. The diffractive grating may extend by at least two modulation periods.

Figure 14:
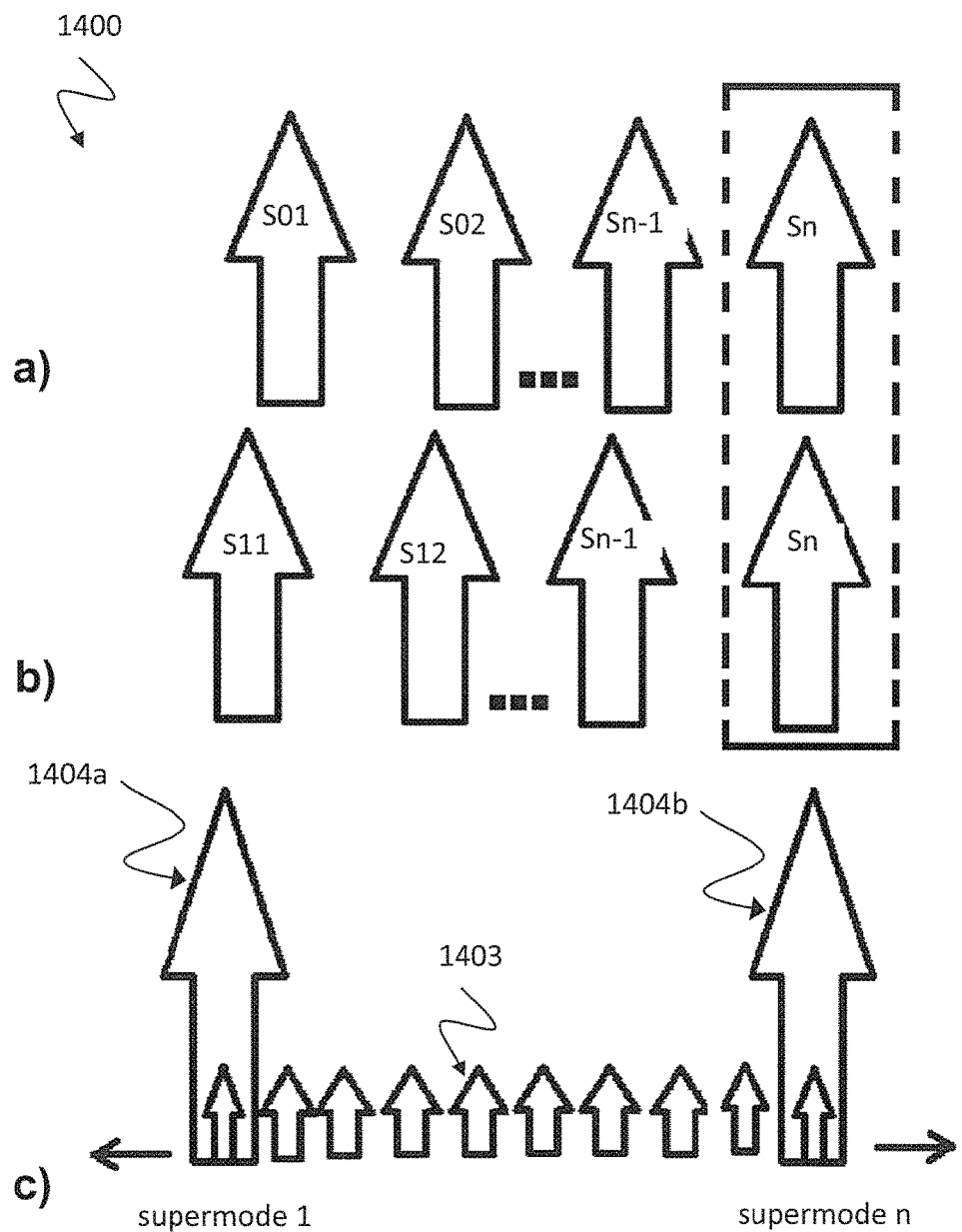
FIG. 14 shows a schematic diagram 1400 illustrating tuning of the supermodes by optical tuners of a multi-channel tunable laser according to an implementation form.

FIG. 14 shows a schematic diagram 1400 illustrating tuning of the supermodes by optical tuners of a multi-channel tunable laser according to an implementation form. The resulting spectrum depicted in FIG. 14c including the constructive and destructive interferences shows high main peaks corresponding to supermodes 1404a, 1404b and smaller side peaks corresponding to inferior cavity modes 1403.

To tune the laser over the C band the devices may use two modes of tuning which are discontinuous tuning using the Vernier effect and continuous tuning between supermodes to access all cavity modes.

First peaks S01, S02, Sn-1, Sn (depicted in FIG. 14a) tuned by a tuning element have a different phase but a similar power than second peaks S11, S12, Sn-1, Sn (depicted in FIG. 14b) tuned by another tuning element, e.g. second optical tuners as described above with respect to FIG. 1. A superimposition of the first peaks and the second peaks in the optical combiner of the half AWG results in constructive and destructive interference resulting in generation of supermodes 1404a, 1404b and inferior cavity modes 1403 as depicted in FIG. 14c. These supermodes 1404a, 1404b occur with a larger period (i.e. smaller frequency) than a period with which the inferior cavity modes 1403 occur.

Figure 15:
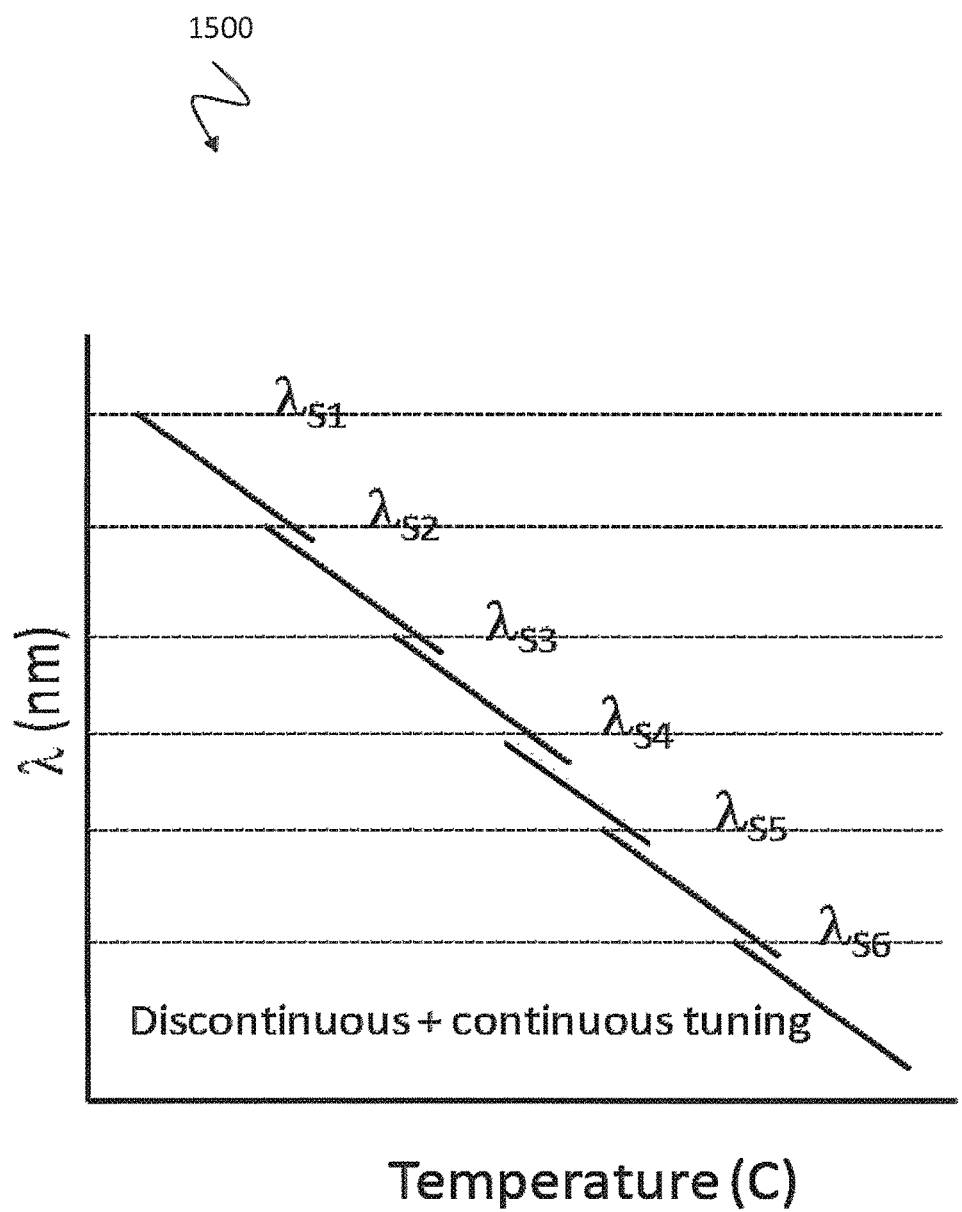
FIG. 15 shows a schematic diagram 1500 illustrating quasi-continuous tuning by optical tuners of a multi-channel tunable laser according to an implementation form.
Figure 16:
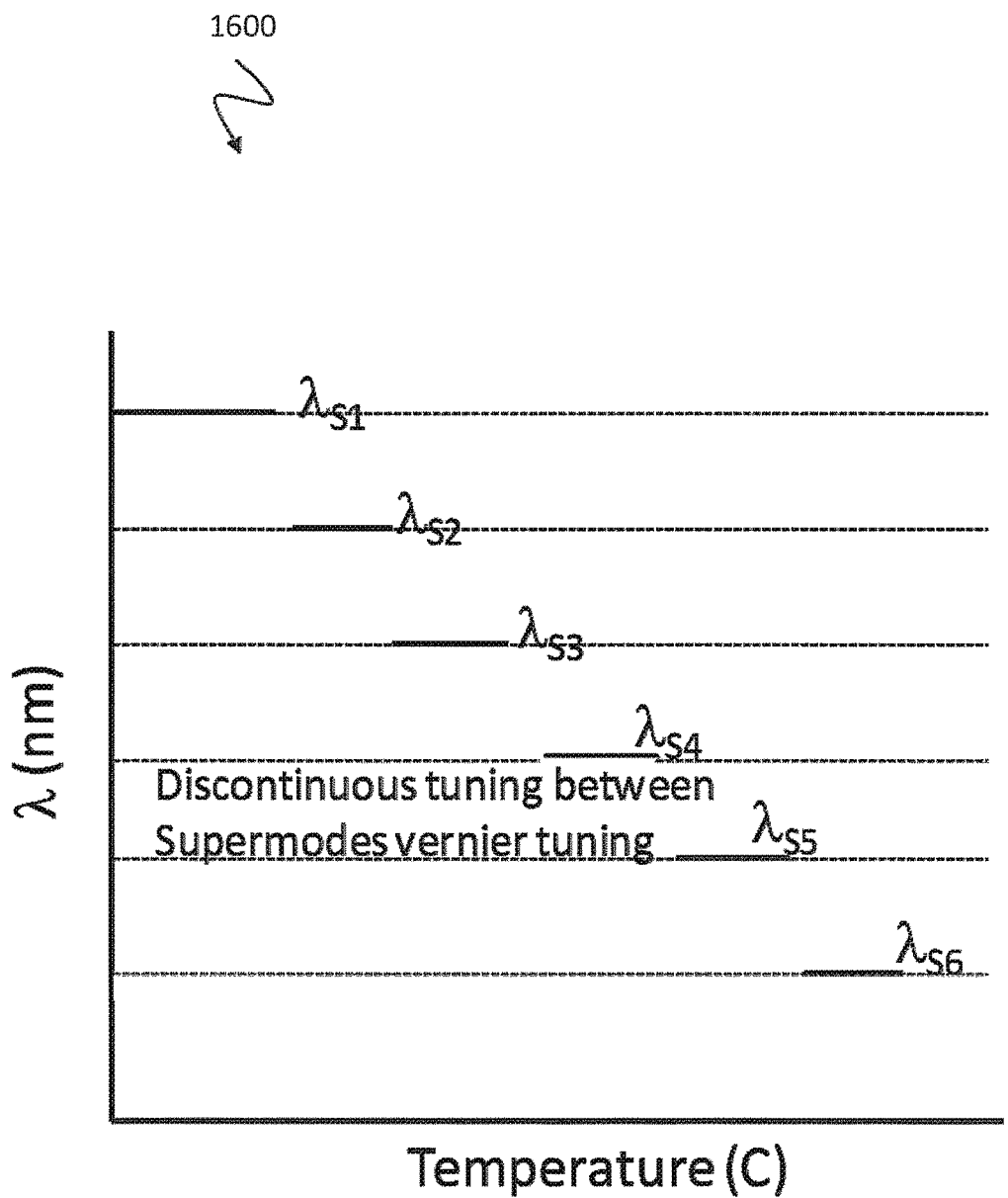
FIG. 16 shows a schematic diagram 1600 illustrating discontinuous tuning by optical tuners of a multi-channel tunable laser according to an implementation form.

FIGS. 15, 16 show the two tuning mechanisms and how the combination of these two tuning mechanisms results in quasi-continuous tuning across the C band. Tuning one frequency comb while the other remains fixed allows the output frequency to "hop" between supermodes (6 nm) using the Vernier effect. Tuning both frequency combs together allows continuous tuning of the mode between to two super modes. A combination of discontinuous and continuous tuning allows access to all cavity modes over the C band. The phase section allows for fine tuning of the selected mode and to be able to offset any drift over the life of the device.

FIG. 15 shows a schematic diagram 1500 illustrating quasi-continuous tuning by optical tuners of a multi-channel tunable laser according to an implementation form. The diagram depicts wavelength λ in nanometer (nm) over temperature in Celsius applied to the thermal tuning elements. Depending on the applied temperature different lasing supermodes $\lambda_{S1}$, $\lambda_{S2}$, $\lambda_{S3}$, $\lambda_{S4}$, $\lambda_{S5}$, $\lambda_{S6}$ occur continuously with the applied temperature.

FIG. 16 shows a schematic diagram 1600 illustrating discontinuous tuning by optical tuners of a multi-channel tunable laser according to an implementation form. The diagram depicts wavelength λ in nanometer (nm) over temperature in Celsius applied to the thermal tuning elements. Depending on the applied temperature different lasing supermodes $\lambda_{S1}$, $\lambda_{S2}$, $\lambda_{S3}$, $\lambda_{S4}$, $\lambda_{S5}$, $\lambda_{S6}$ occur discontinuously, i.e. in steps, with the applied temperature.

Figure 17:
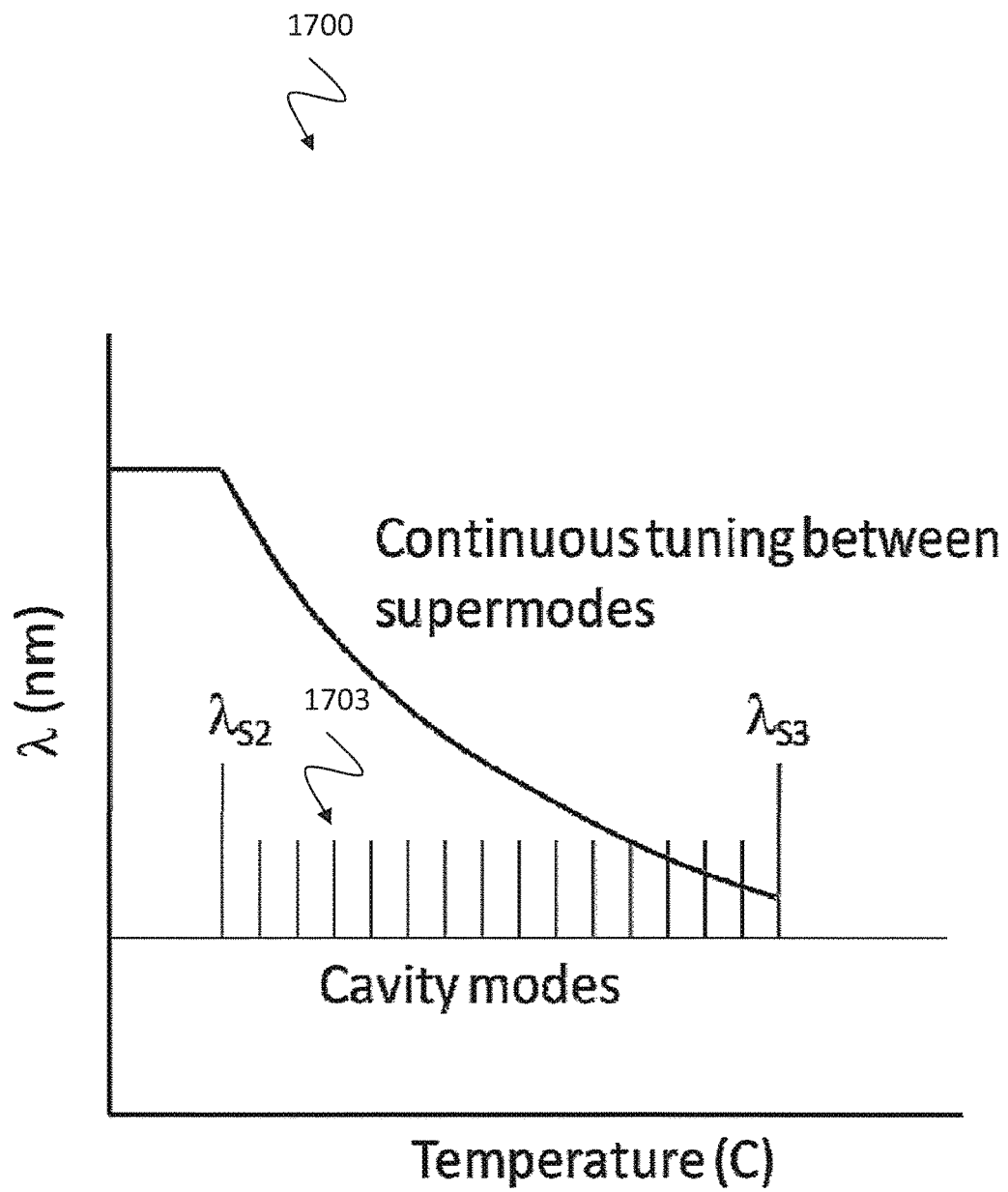
FIG. 17 shows a schematic diagram 1700 illustrating continuous tuning between supermodes by optical tuners of a multi-channel tunable laser according to an implementation form.

FIG. 17 shows a schematic diagram 1700 illustrating continuous tuning between supermodes by optical tuners of a multi-channel tunable laser according to an implementation form. The diagram depicts wavelength λ in nanometer (nm) over temperature in Celsius applied to the thermal tuning elements. Depending on the applied temperature different lasing supermodes $\lambda_{S2}$, $\lambda_{S3}$ and different inferior cavity modes 1203 occur allowing continuous tuning between the supermodes.

Figure 18:
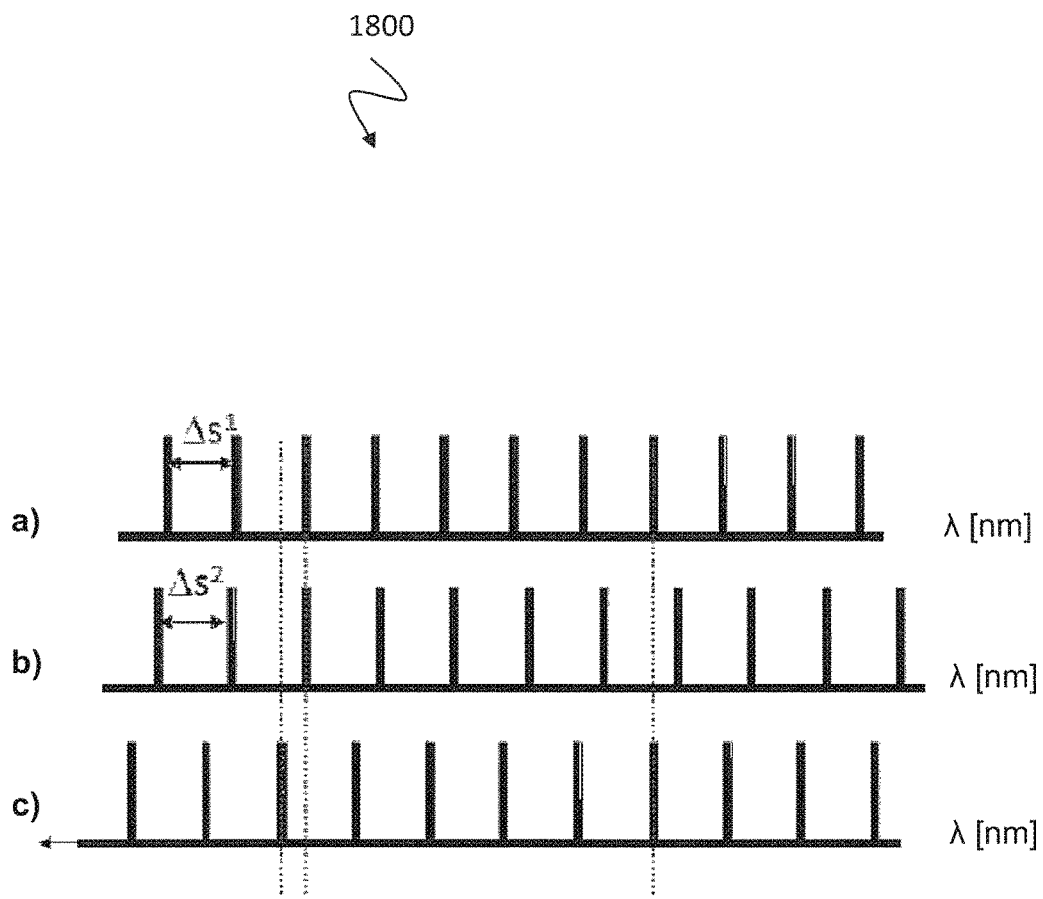
FIG. 18 shows a schematic diagram 1800 illustrating Vernier effects in comb reflection spectra of a multi-channel tunable laser according to an implementation form.

FIGS. 18a to 18c show a schematic diagram 1800 illustrating Vernier effects in comb reflection spectra of a multi-channel tunable laser according to an implementation form. FIG. 18a illustrates tuning of one grating for coarse tuning of about 4-5 nm jumps. FIG. 18b illustrates tuning both (gratings) together for fine tuning (cavity FP modes). FIG. 18c illustrates phase section tuning to allow complete coverage. The FIGS. 18a to 18c illustrate tuning effects of the second optical tuners 3 and the first optical tuner 2 as described above with respect to FIGS. 1 to 17.

Figure 19A:
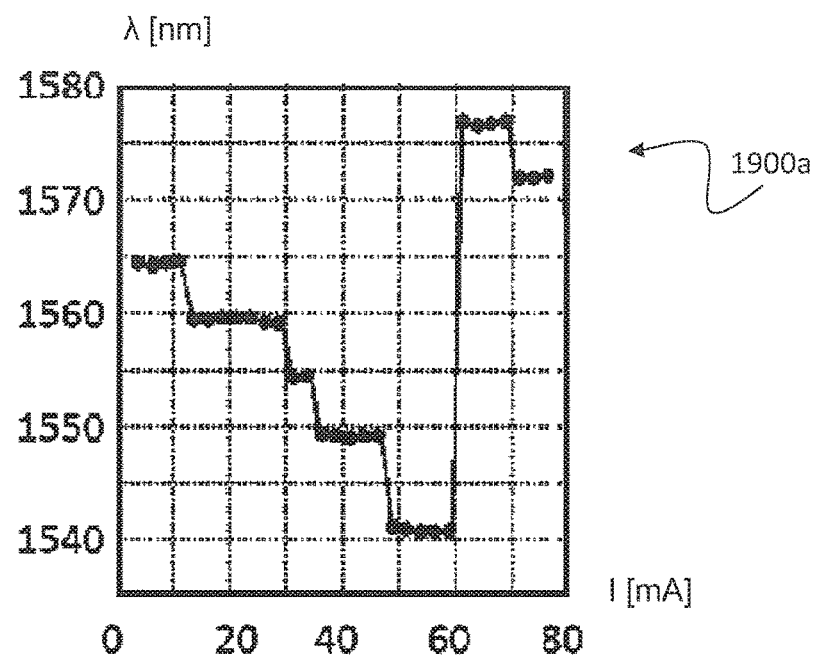
FIGS. 19a and 19b show schematic diagrams 1900a, 1900b illustrating course tuning (FIG. 19a) by using the first optical tuner and fine tuning (FIG. 19b) by using the plurality of second optical tuners of a multi-channel tunable laser according to an implementation form.

FIG. 19a shows a schematic diagram 1900a illustrating wavelength λ over tuning current I for course tuning as described above with respect to FIG. 18. Course tuning may be achieved by using the first optical tuner 2 as described above with respect to FIG. 1. Coarse tuning may be applied over a predetermined frequency band, e.g. between 1540 nm and 1580 nm or e.g. the C-band ranging between 1530 nm and 1565 nm.

Figure 19B:
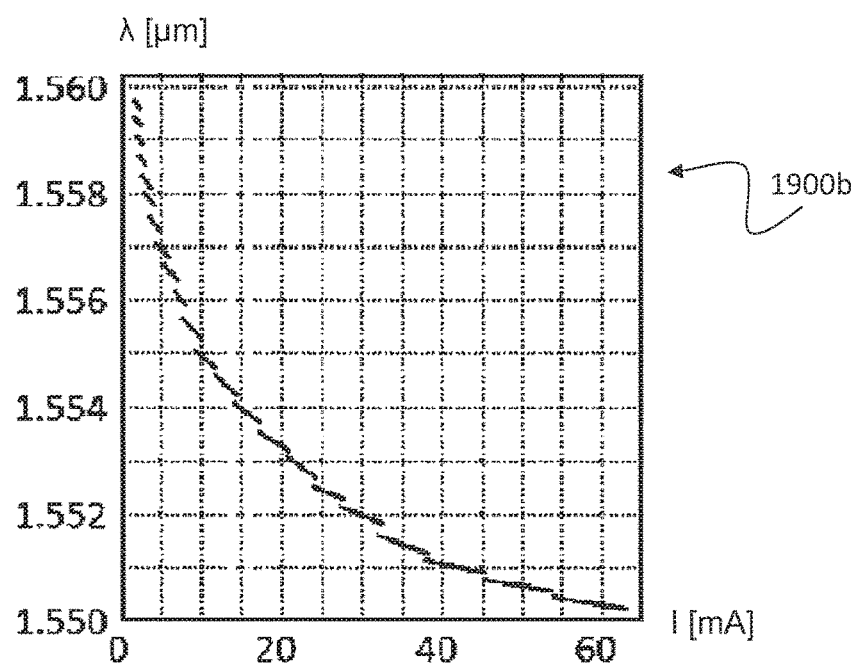

FIG. 19b shows a schematic diagram 1900b illustrating wavelength over tuning current I for fine tuning as described above with respect to FIG. 18. Fine tuning may be achieved by using the second optical tuners 3 as described above with respect to FIG. 1.

Fine tuning may be applied over a small frequency band, e.g. between 1550 nm and 1560 nm.

Figure 20:
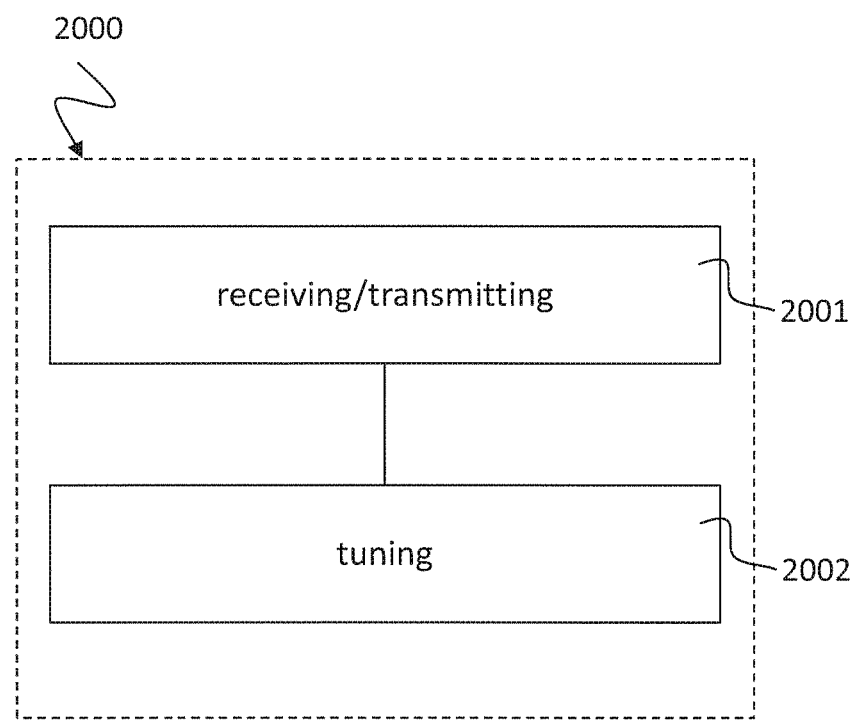
FIG. 20 shows a schematic diagram illustrating a method 2000 for multi-channel tuning laser light according to an implementation form.

FIG. 20 shows a schematic diagram illustrating a method 2000 for multi-channel tuning laser light according to an implementation form.

The method 2000 includes receiving/transmitting 1201 light beams by plurality of channel terminals 103 of a frequency selective optical multiplexer 101, each channel terminal 103 coupled to a respective channel path 105 of a plurality of channel paths 105, wherein each channel path 105 comprises a gain element 7, a phase element 6 and a reflective element 8; and wherein the frequency selective optical multiplexer comprises a plurality of channel waveguide blocks 104, each channel waveguide block 104 comprising at least one reflectively terminated 1 channel waveguide 4, and an optical coupling element 5 optically coupling the plurality of channel terminals 103 with the plurality of channel waveguide blocks 104, each of the channel waveguides 4 of the plurality of channel waveguide blocks 104 having a different length. The method 2000 includes tuning 1202 of the channel waveguides 4 of a respective channel waveguide block 104 by a plurality of second optical tuners 3, e.g. second optical tuners 3 as described above with respect to FIGS. 1-19, each one coupled to a respective channel waveguide block 104 of the plurality of channel waveguide blocks 104.

The method 2000 may further include tuning of the channel waveguides 4 of the plurality of channel waveguide blocks 104 by a first optical tuner, e.g. a first optical tuner 2 as described above with respect to FIGS. 1-19, coupled to the channel waveguides 4 of the plurality of channel waveguide blocks 104.

The frequency selective optical multiplexer may correspond to a frequency selective optical multiplexer as described above with respect to FIGS. 1 to 19. The reflective termination may correspond to the reflective termination as described above with respect to FIGS. 1 to 19. The method may be implemented by using a multi-channel tunable laser as described above with respect to FIGS. 1 to 19.

Figure 21A:
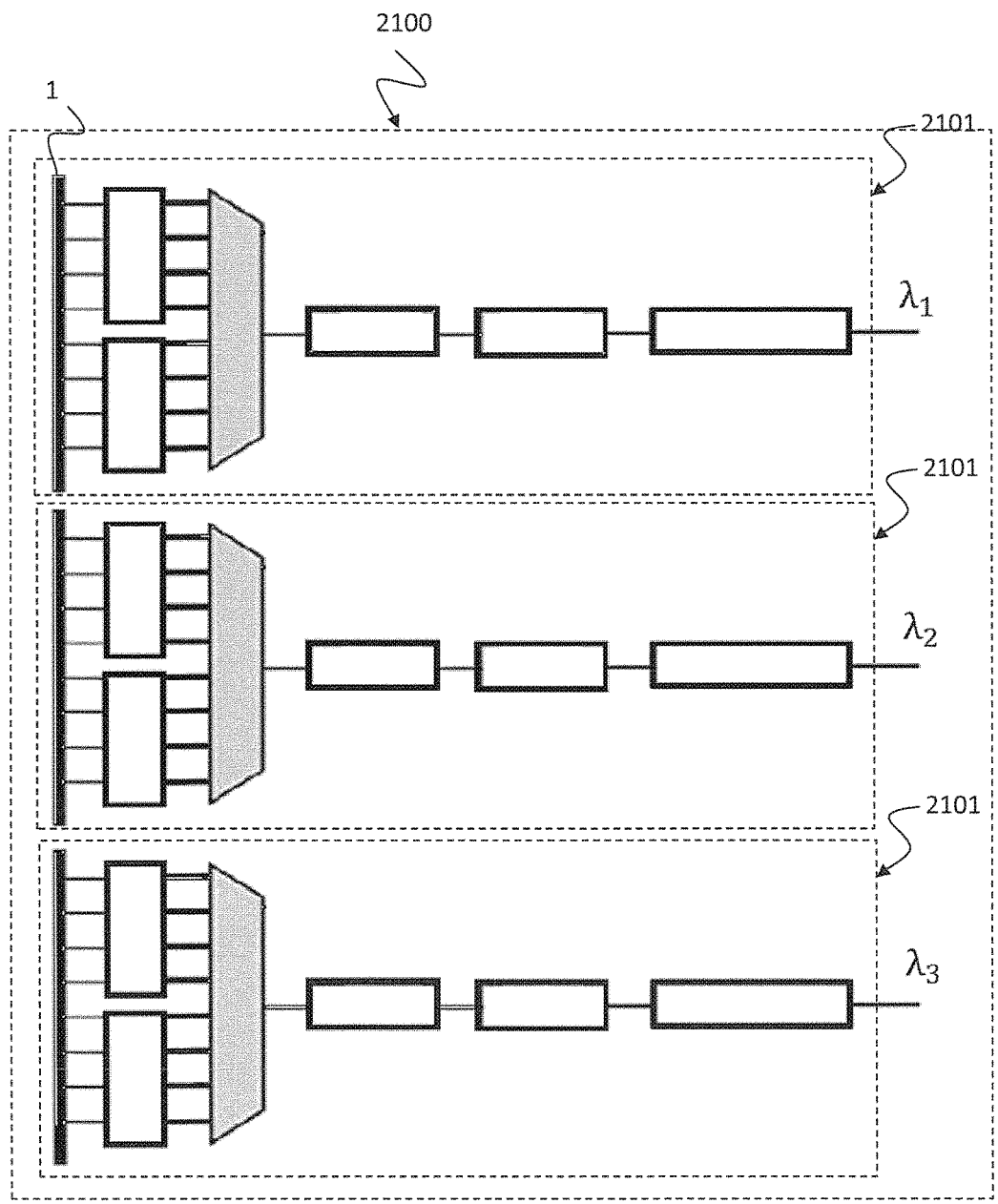
FIG. 21a shows a schematic diagram illustrating the architecture of a multi-channel tunable laser 2100 comprising a plurality of single-channel tunable lasers 2101 according to an implementation form.

FIG. 21a shows a schematic diagram illustrating the architecture of a multi-channel tunable laser 2100 comprising a plurality of single-channel tunable lasers 2101 according to an implementation form. The multi-channel tunable laser 2100 includes a plurality of single-channel tunable laser 2101 as described below with respect to FIG. 21b forming an array of single-channel tunable lasers 2101, for example by a parallel connection of the single-channel tunable lasers 2101, to provide a plurality of optical channel paths $\lambda_1$, $\lambda_2$, $\lambda_3$. Each optical channel paths $\lambda_1$, $\lambda_2$, $\lambda_3$ may generate a single frequency or a full frequency band as described above with respect to FIGS. 10a, 10b, 11a, 11b. The reflective terminations 1 of the individual single-channel tunable lasers 2101 may be implemented separately for each single-channel tunable laser 2101 or may be implemented as a single reflective termination 1 or high reflective coating for more than one single-channel tunable lasers 2101, in particular implemented as one single reflective coating 1 for the whole multi-channel tunable laser 2100.

Figure 21B:
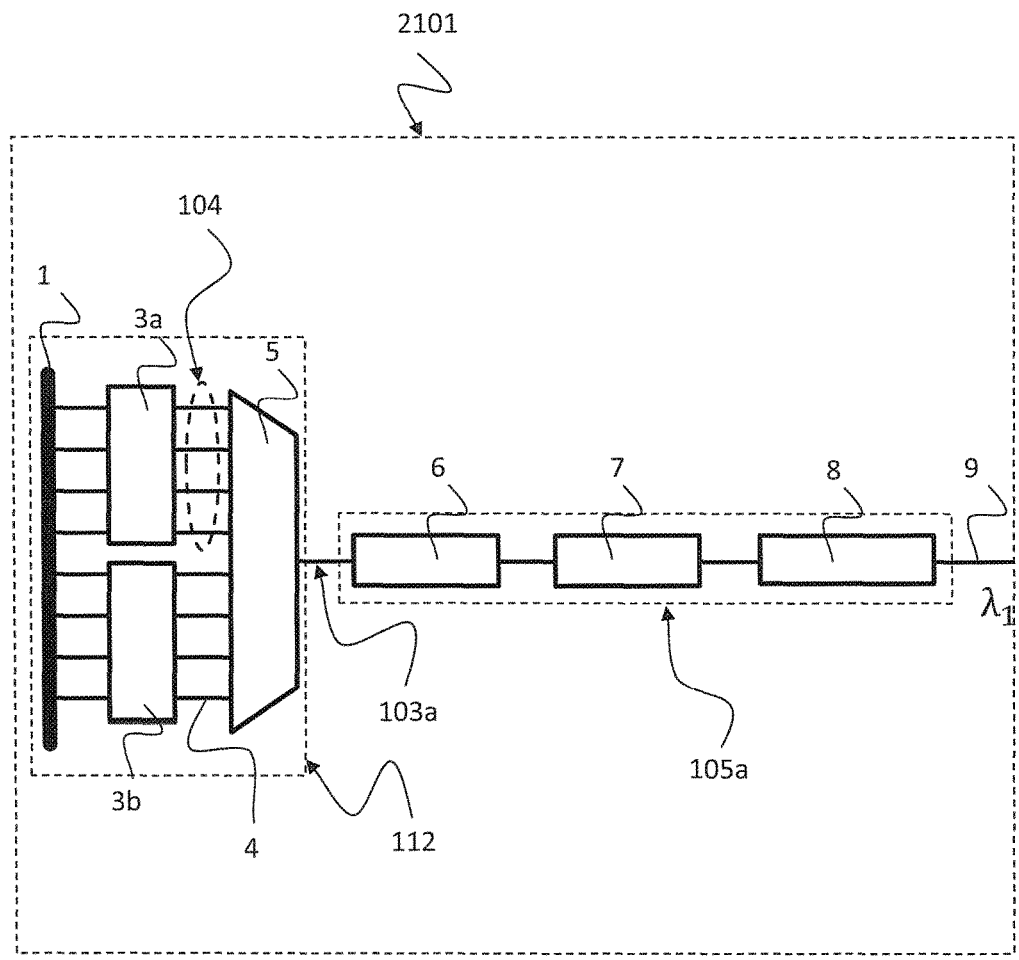

FIG. 21b shows a schematic diagram illustrating one single-channel tunable laser 2101 that is used in the multi-channel tunable laser 2100 of FIG. 21a.

The tunable laser 2101 for tuning a lasing mode based on light beams travelling through at least one block of channel waveguides 104 with at least two tunable combs includes a frequency selective optical multiplexer 112, a gain element 7, a phase element 6 and a plurality of optical tuners 3a, 3b. The plurality of optical tuners 3a, 3b may correspond to the plurality of second optical tuners 3a, 3b as described above with respect to FIG. 1.

The frequency selective optical multiplexer 112 includes a first terminal 103a for receiving/transmitting light, at least one block of channel waveguides 104, each channel waveguide 104 having a reflectively coated first tail 1 and a second tail, and an optical coupling element 5 optically coupling the first terminal 103a with the second tails of the channel waveguides 104 of the at least one block of channel waveguides. Each of the channel waveguides 104 has a different length. The gain element 7 generates a broad spectrum of light. The gain element 7 couples the first terminal 103a of the frequency selective optical multiplexer 112 with the reflective element 1. The phase element 6 is coupled to the gain element 7. The phase element 6 is configured to fine-tune the lasing mode and to offset a phase drift of the tunable laser. Each one of the plurality of optical tuners 3a, 3b is coupled to a respective plurality of branches of the at least one block of channel waveguides 104. The plurality of optical tuners 3a, 3b is configured to tune a lasing mode based on light beams travelling through the at least one block of channel waveguides 104.

The function of the tunable laser 2101 may correspond to the function of the tunable laser 100 described above with respect to FIG. 1 when only a single optical path 105 is connected to the frequency selective optical multiplexer 101.

The frequency selective optical multiplexer 112 may include a half section of an arrayed waveguide grating multiplexer as described above with respect to FIGS. 2 to 4. The plurality of optical tuners may include two optical tuners, a first optical tuner 3a coupled to a first plurality of branches of the at least one block of channel waveguides 104; and a second optical tuner 3b coupled to a second plurality of branches of the at least one block of channel waveguides 104. The first plurality of branches of the at least one block of channel waveguides 104 may include a portion of the branches, in particular a half of the branches of the at least one block of channel waveguides 104 as described above with respect to FIGS. 2 to 4.

A first one of the plurality of optical tuners 3a may be configured to tune the lasing mode based on modifying a refractive index of channel waveguides 104 of the respective plurality of branches coupled to the first one 3a of the plurality of optical tuners. A second one of the plurality of optical tuners 3b may be configured to tune the lasing mode based on modifying a refractive index of channel waveguides 104 of the respective plurality of branches coupled to the second one 3b of the plurality of optical tuners as described above with respect to FIGS. 12-17. The optical tuners 3a, 3b may be configured to modify the refractive index based on thermal tuning, current injection, voltage or stress. The optical tuners 3a, 3b may be independently tunable.

The optical tuners 3a, 3b may be configured for discontinuous tuning by tuning one frequency comb generated by a first plurality of branches of the at least one block of channel waveguides 104 while the other frequency comb generated by a second plurality of branches remains fixed as described above with respect to FIG. 16. The optical tuners 3a, 3b may be configured for continuous tuning by tuning both of the frequency combs together as described below with respect to FIG. 17. The optical tuners 3a, 3b may be configured to combine continuous tuning and discontinuous tuning as described below with respect to FIG. 15.

The reflective element 8 may include a broadband partial reflector section. The broadband partial reflector section may include a passive chirped grating section as described above with respect to FIG. 13.

The optical coupling element 5 may include a star coupler. The optical coupling element 5 may include a free propagation region coupling the first terminal 103a with the at least one block of channel waveguides 104 such that light beams travelling through the at least one block of channel waveguides 104 are constructively and destructively interfering in the free propagation region.

The single-tunable laser 2101 may be integrated together with other single-tunable lasers 2101 forming a multi-channel tunable laser 2100 on a chip. The multi-channel tunable laser 2100 may be integrated together with a semiconductor optical amplifier on a chip.

The multi-channel tunable laser 2100 may also be denoted as AWG multi-channel tunable laser as the frequency selective optical multiplexer may include half an AWG. The single-channel tunable laser 2101 may include a HR (highly reflective) reflection 1 to reflect the signal back into the AWG, doubling the effective AWG length. The frequency selective optical multiplexer 112 may include half an AWG to reduce the complexity, footprint and cost of the chip. The single-channel tunable laser 2101 may include two tuning elements each covering a half of the AWG branches. The tuning elements 3a, 3b may be used for (thermal) wavelength tuning of the refractive index of the branches, thereby emulating two AWGs from one half of an AWG. The tunable laser 2101 may include a phase section or phase element 6. The tunable laser 2101 may include a gain element 7, e.g. gain chip or gain section. The tunable laser 2101 may include a reflective element, e.g. a passive chirped grating section serving as a broadband waveguide reflector.

The high reflection coating 1 at the first tail may act as the cavity reflector for the lasing effect. This may be necessary for the lasing to occur. The optical tuners 3a, 3b may tune groups of AWG branches over a selected frequency range, using the Vernier effect. These tuners may be thermal tuners, for example. The half Arrayed waveguide grating (AWG) provides the frequency comb effect as shown in the FIG. 5. The gain chip 7 and the phase block 6 may be required for generating the lasing effect and for fine tuning. A passive chirped grating of the reflective element 8 may be necessary for the lasing to occur. The AWG branches may provide a wavelength equal to 2 times the branch length times the index. Laser light may be emitted at an output 9.

The gain chip 7 may generate a broad spectrum that travels between the high reflection coating 1 and the passive chirped grating 8. The passive chirped grating 8 may act as a broadband mirror reflecting some of the light back into the cavity formed by the elements 1, 104 and 5 to ensure lasing action occurs. The AWG may act as a frequency selective filter (demultiplexer). The selected frequencies may be determined by the length of the AWG branches 4. A comb of frequencies may be generated by a number of branches 4 of different path lengths. The two sets of combs may have different path length difference, to generate two frequency combs with different spacing. In the absence of tuners, the light reflected back from the HR coating 1 (or other reflective means) may interfere in the AWG's FRP (Free Propagation Region) and the single selected frequency to lase is the result of constructive and destructive interference between the two frequency combs 501, 502 and 510 as shown in FIG. 5. The tuners 3a, 3b may use thermal tuning to ensure narrow linewidth and low loss, however alternative tuning may be used too, such as current injection. In order to tune the device between two supermodes across the C-band, both tuners may be activated simultaneously.

The tunable laser 2101 may be designed to use half an arrayed waveguide grating (AWG) with high reflectivity (HR) coating and tuning to reflect the signal back into the AWG and tune the AWG branches and thereby the half AWG acts as two full AWGs. The tuning elements 3a, 3b may tune the AWG branches, e.g. by applying thermal tuning, so as to create two AWGs out of the one while the HR coating 1 reduces the AWG to half the size. The AWG may act as an external cavity for the laser. All conventional tunable lasers that use AWGs use at least one full AWG. The passive chirped grating 8 may act as a waveguide reflector for broadband and enables laser integration with an SOA (semiconductor optical amplifier) that can connect to other devices such as modulators.

The half AWG reduces the footprint of the chip (chip real estate), reduces the complexity of the fabrication process and thereby reduces the chip cost. The laser 2101 may make use of passive chirped grating as the reflective means 8, thereby enabling a plurality of the single-channel tunable lasers 2101 forming a multi-channel tunable laser 2100 to be integrated to an SOA and then to other devices; e.g. Electro-Absorption Modulators (EAMs) and other modulators and devices.

The methods, systems and devices described herein may be implemented as optical circuit within a chip or an integrated circuit or an application specific integrated circuit (ASIC). The invention can be implemented in digital and/or analogue electronic and optical circuitry.

While a particular feature or aspect of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A multi-channel tunable laser, comprising:
    a frequency selective optical multiplexer comprising:
        a plurality of channel terminals for receiving and transmitting light;
        a plurality of channel waveguide blocks, each channel waveguide block comprising at least one reflectively terminated channel waveguide, wherein each of the channel waveguides of the plurality of channel waveguide blocks has a different length, and wherein each of the channel waveguides of the plurality of channel waveguide blocks is configured to generate a comb of frequencies of different path lengths, wherein different combs of frequencies having different path lengths have different spacings; and
        an optical coupling element optically coupling the plurality of channel terminals with the plurality of channel waveguide blocks;
    a plurality of channel paths, each channel path coupled to a respective channel terminal of the plurality of channel terminals and comprising a gain element, a phase element, and a reflective element; and
    a plurality of optical tuners, each optical tuner configured to tune the channel waveguides of a respective channel waveguide block of the plurality of channel waveguide blocks, wherein the plurality of optical tuners is configured to modify a refractive index of the channel waveguides based on at least one of voltage and stress,
    wherein the optical coupling element comprises a free propagation region coupling the plurality of channel terminals with the plurality of channel waveguide blocks such that light beams travelling through the plurality of channel waveguide blocks are constructively and destructively interfering in the free propagation region, and wherein the free propagation region is designed such that a light beam tuned by at least one of the plurality of optical tuners is propagating through the free propagation region without interfering with a light beam tuned by another one of the plurality of optical tuners.

2. The multi-channel tunable laser of claim 1, wherein the frequency selective optical multiplexer comprises a half section of an arrayed waveguide grating multiplexer.

3. The multi-channel tunable laser of claim 1, wherein the reflective termination of the at least one reflectively terminated channel waveguide is outside of the optical coupling element.

4. The multi-channel tunable laser of claim 1, wherein the reflective termination of the at least one reflectively terminated channel waveguide comprises one of a reflective coating, a broadband grating and a mirror.

5. The multi-channel tunable laser of claim 1, wherein each optical tuner in the plurality of optical tuners is independently tunable.

6. The multi-channel tunable laser of claim 1,
    wherein the optical coupling element comprises a multi-star coupler.

7. The multi-channel tunable laser of claim 6,
    wherein the multi-star coupler is designed to couple a respective portion of the channel waveguides to a respective channel terminal of the plurality of channel terminals.

8. The multi-channel tunable laser of claim 6,
    wherein the multi-star coupler is designed based on a Rowland circle.

9. The multi-channel tunable laser of claim 8,
    wherein an angle of the Rowland circle is designed such that light beams propagating through different channel terminals of the plurality of channel terminals do not interfere.

10. The multi-channel tunable laser of claim 1, wherein the optical tuners are configured
    to tune the channel waveguides so as to produce light of a single frequency in each of the channel paths; or
    to tune the channel waveguides so as to produce light of a full predetermined range of frequencies in each of the channel paths.

11. The multi-channel tunable laser of claim 10, wherein the optical tuners are configured to tune the channel waveguides so as to produce a different single frequency or to produce the same single frequency in each of the channel paths.

12. A method for multi-channel tuning laser light, the method comprising:

receiving and transmitting light beams by a plurality of channel terminals of a frequency selective optical multiplexer, each channel terminal coupled to a respective channel path of a plurality of channel paths, wherein each channel path comprises a gain element, a phase element, and a reflective element, and wherein the frequency selective optical multiplexer comprises a plurality of channel waveguide blocks, each channel waveguide block comprising at least one reflectively terminated channel waveguide, and wherein an optical coupling element optically couples the plurality of channel terminals with the plurality of channel waveguide blocks, and wherein each of the channel waveguides of the plurality of channel waveguide blocks has a different length, and wherein each of the channel waveguides of the plurality of channel waveguide blocks is configured to generate a comb of frequencies of different path lengths, wherein different combs of frequencies having different path lengths have different spacings; and tuning the channel waveguides of a respective channel waveguide block by a plurality of optical tuners, each optical tuner coupled to a respective channel waveguide block of the plurality of channel waveguide blocks, wherein the plurality of optical tuners is configured to modify a refractive index of the channel waveguides based on at least one of voltage and stress;

wherein the optical coupling element comprises a free propagation region coupling the plurality of channel terminals with the plurality of channel waveguide blocks such that light beams travelling through the plurality of channel waveguide blocks are constructively and destructively interfering in the free propagation region, and wherein the free propagation region is designed such that a light beam tuned by at least one of the plurality of optical tuners is propagating through the free propagation region without interfering with a light beam tuned by another one of the plurality of optical tuners.

13. The method of claim 12, wherein the frequency selective optical multiplexer comprises a half section of an arrayed waveguide grating multiplexer.

14. The method of claim 12, wherein the reflective termination of the at least one reflectively terminated channel waveguide is outside of the optical coupling element.

15. The method of claim 12, wherein the reflective termination of the at least one reflectively terminated channel waveguide comprises one of a reflective coating, a broadband grating and a mirror.

16. The method of claim 12, wherein each optical tuner in the plurality of optical tuners is independently tunable.

* * * * *